(12) United States Patent
Isono et al.

(10) Patent No.: US 9,184,316 B2
(45) Date of Patent: Nov. 10, 2015

(54) SOLID-STATE IMAGING APPARATUS AND METHOD FOR MANUFACTURING SAME

(71) Applicant: PANASONIC CORPORATION, Osaka (JP)

(72) Inventors: Shunsuke Isono, Toyama (JP); Tetsuya Ueda, Toyama (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 14/158,578

(22) Filed: Jan. 17, 2014

(65) Prior Publication Data

US 2014/0131828 A1  May 15, 2014

Related U.S. Application Data

(63) Continuation of application No. PCT/JP2012/004288, filed on Jul. 3, 2012.

(30) Foreign Application Priority Data

Aug. 2, 2011 (JP) ................................. 2011-169242

(51) Int. Cl.
*H01L 31/0224* (2006.01)
*H01L 27/146* (2006.01)

(52) U.S. Cl.
CPC ........ *H01L 31/0224* (2013.01); *H01L 27/1464* (2013.01); *H01L 27/14636* (2013.01)

(58) Field of Classification Search
CPC ........................ H01L 27/307; H01L 27/1464
USPC ............................................ 257/459; 438/98
See application file for complete search history.

(56) References Cited

U.S. PATENT DOCUMENTS

| 7,671,386 B2* | 3/2010 | Kuriyama | 257/239 |
| 2007/0279661 A1* | 12/2007 | Misawa | 358/1.9 |

(Continued)

FOREIGN PATENT DOCUMENTS

| JP | 61-255062 A | 11/1986 |
| JP | 01-295457 A | 11/1989 |
| JP | 2007-324248 A | 12/2007 |

(Continued)

OTHER PUBLICATIONS

International Search Report issued in PCT/JP2012/004288, dated Aug. 7, 2012.

*Primary Examiner* — Yu-Hsi D Sun
*Assistant Examiner* — Chi-Hua Yang
(74) *Attorney, Agent, or Firm* — McDermott Will & Emery LLP

(57) ABSTRACT

An insulating layer is layered above a substrate, and a plurality of pixel electrodes are formed above the insulating layer in a matrix with intervals therebetween. A photoelectric conversion layer and an opposing electrode are formed in respective order above the pixel electrodes. A dummy layer is formed above the insulating layer in a region that in plan-view is more peripheral than a pixel region in which the pixel electrodes are formed. The dummy layer is formed from the same material as the pixel electrodes. The dummy layer is composed of a plurality of dummy layer portions that are each equal to each of the pixel electrodes in terms of size in plan-view. The dummy layer functions as a support layer for planarization during polishing by chemical mechanical polishing.

12 Claims, 19 Drawing Sheets

(56) References Cited

U.S. PATENT DOCUMENTS

| | | | |
|---|---|---|---|
| 2008/0246107 A1* | 10/2008 | Maehara | 257/432 |
| 2008/0283881 A1* | 11/2008 | Lee | 257/292 |
| 2009/0065828 A1* | 3/2009 | Hwang | 257/292 |
| 2010/0110271 A1* | 5/2010 | Yanagita et al. | 348/340 |
| 2010/0230583 A1* | 9/2010 | Nakata et al. | 250/227.2 |
| 2011/0049665 A1* | 3/2011 | Goto | 257/459 |

FOREIGN PATENT DOCUMENTS

| | | |
|---|---|---|
| JP | 2008-288550 A | 11/2008 |
| JP | 2009-117802 A | 5/2009 |
| JP | 2011-054746 A | 3/2011 |

* cited by examiner

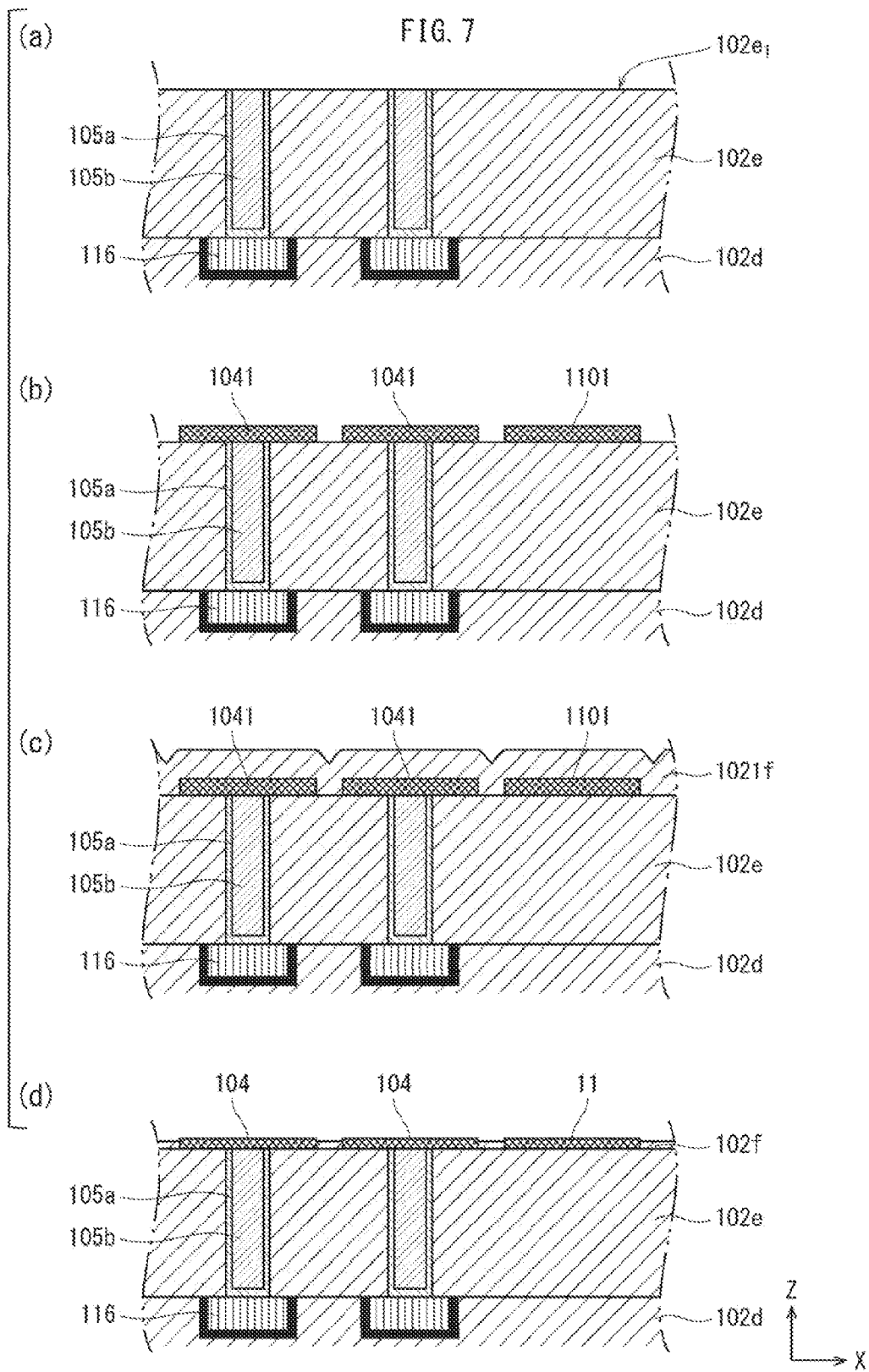

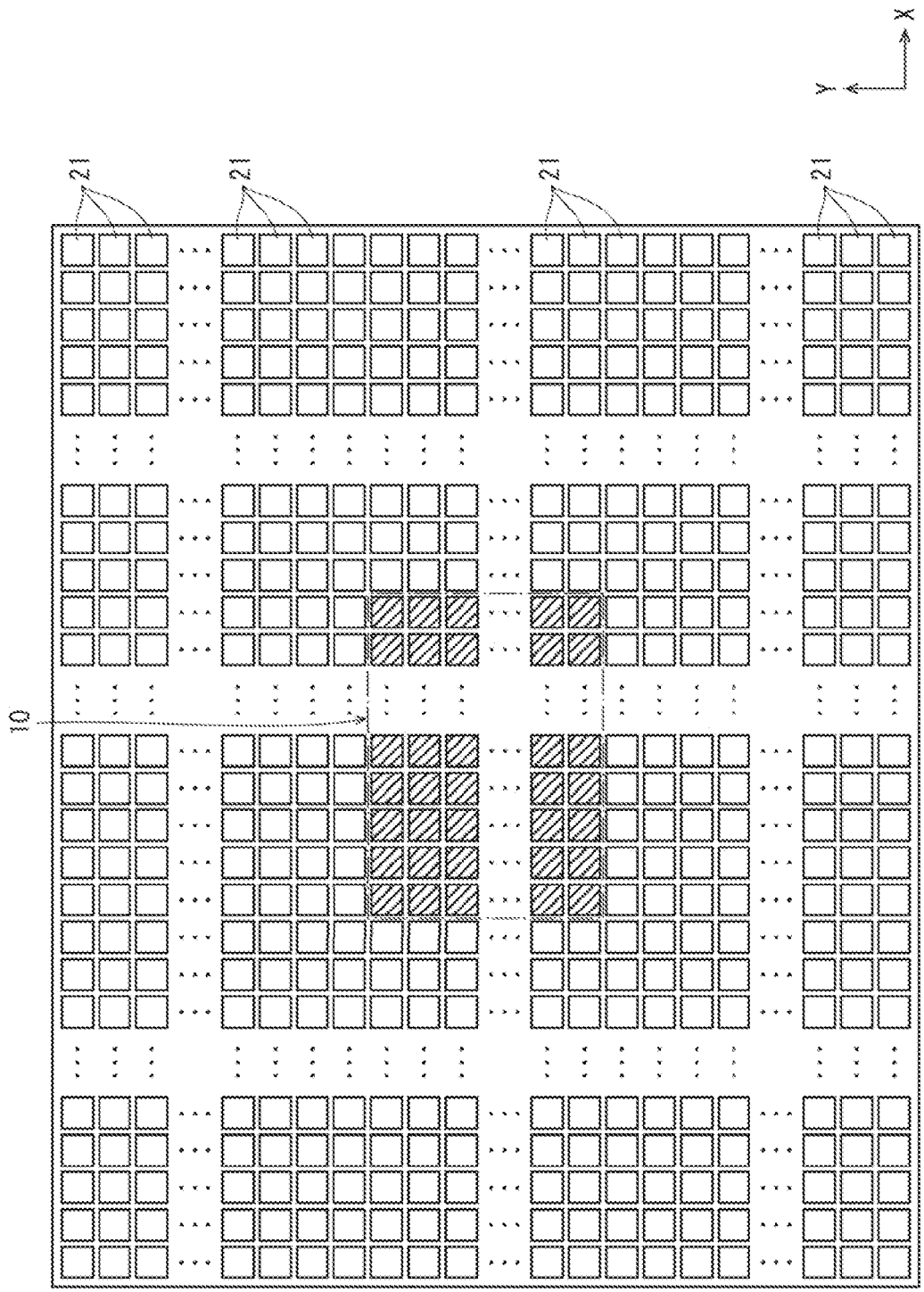

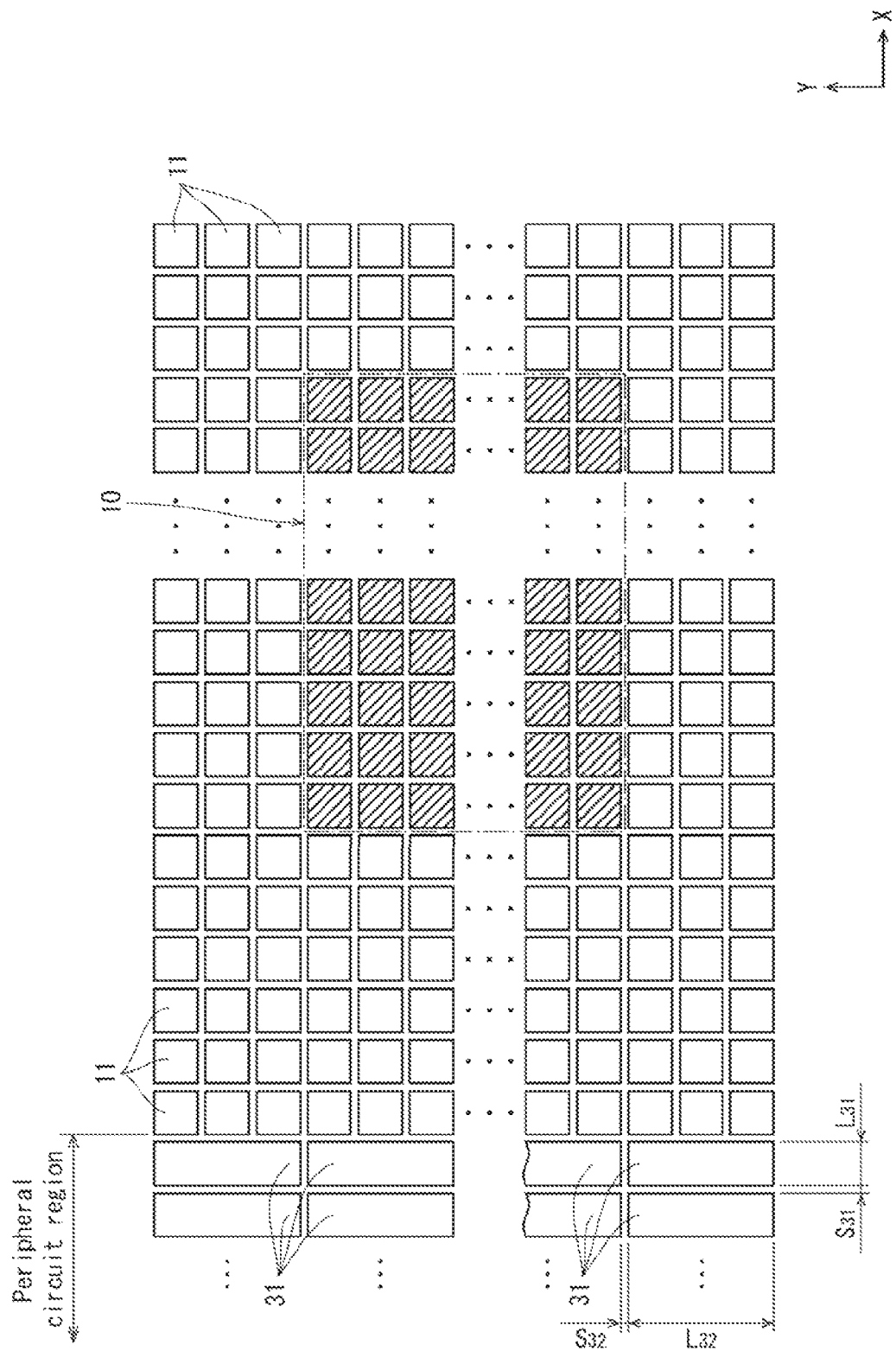

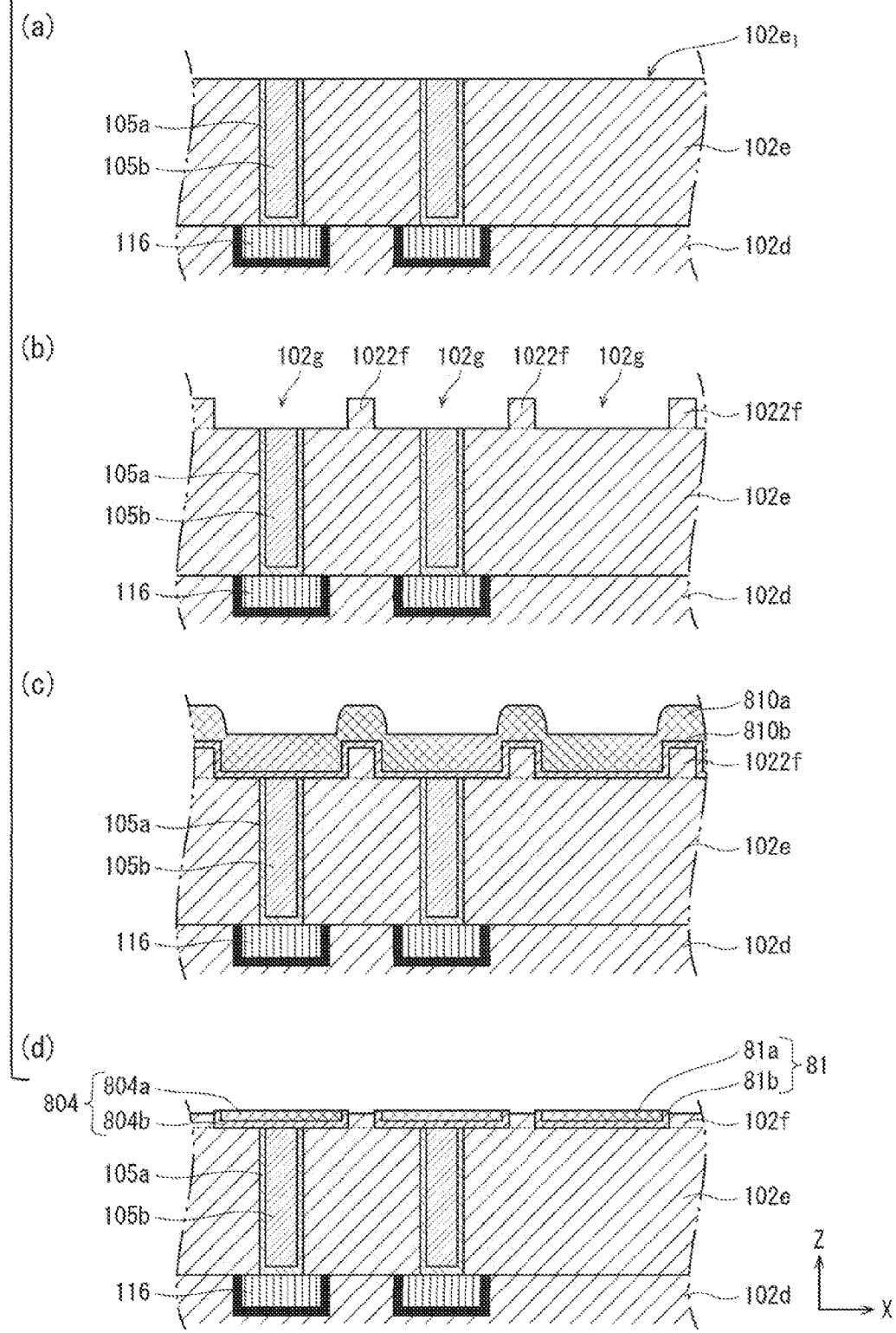

FIG. 15
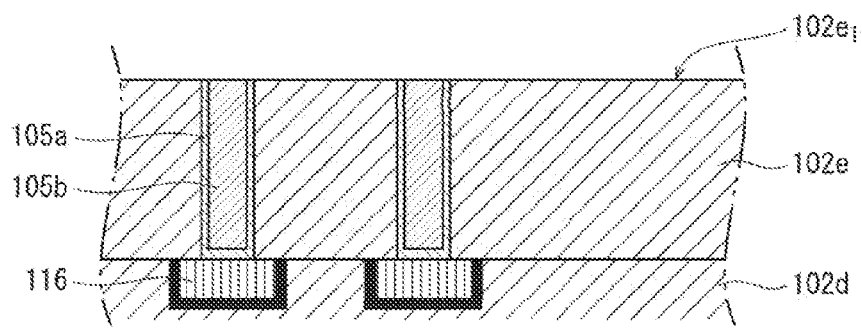
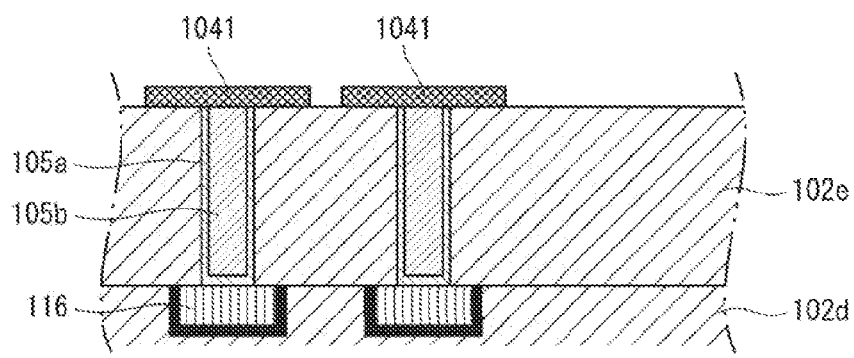
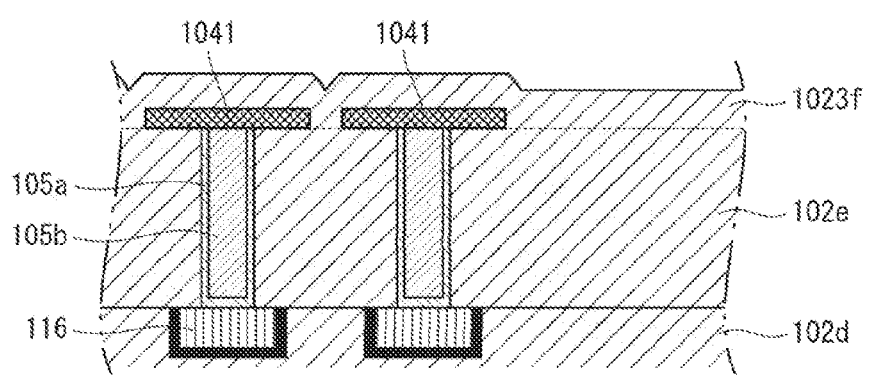

FIG. 17
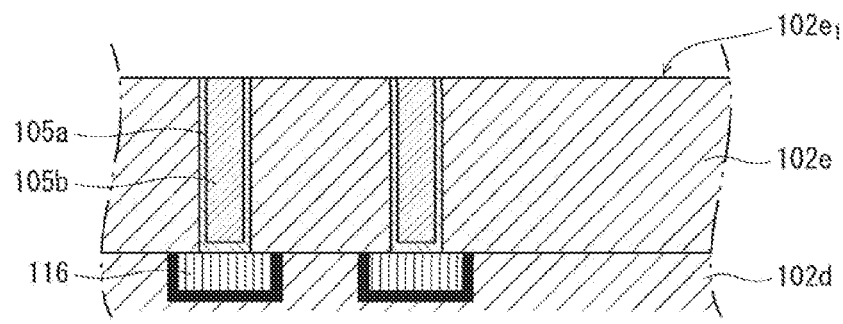
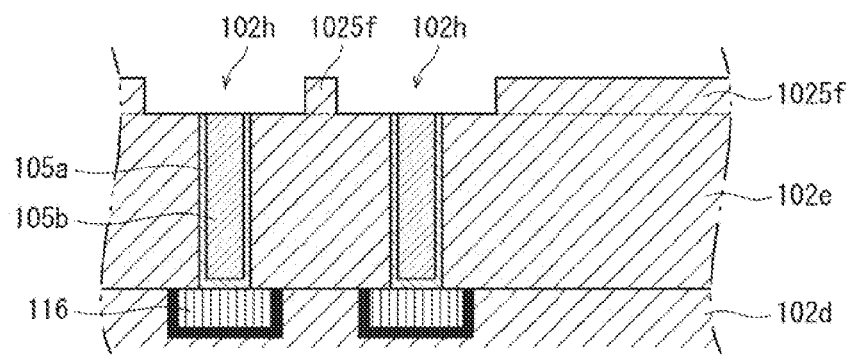
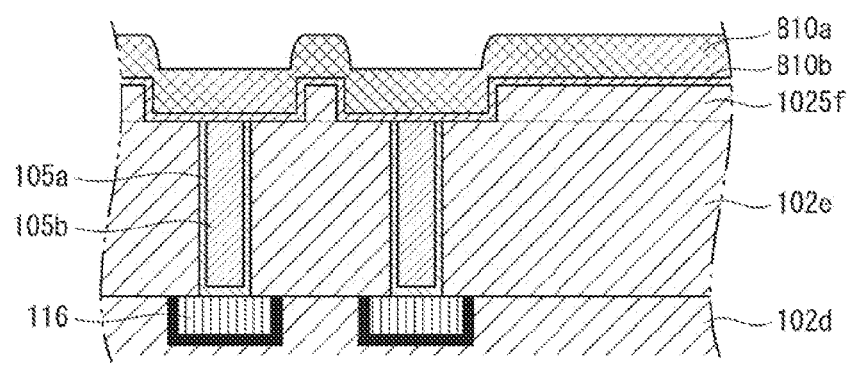
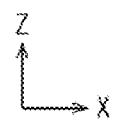

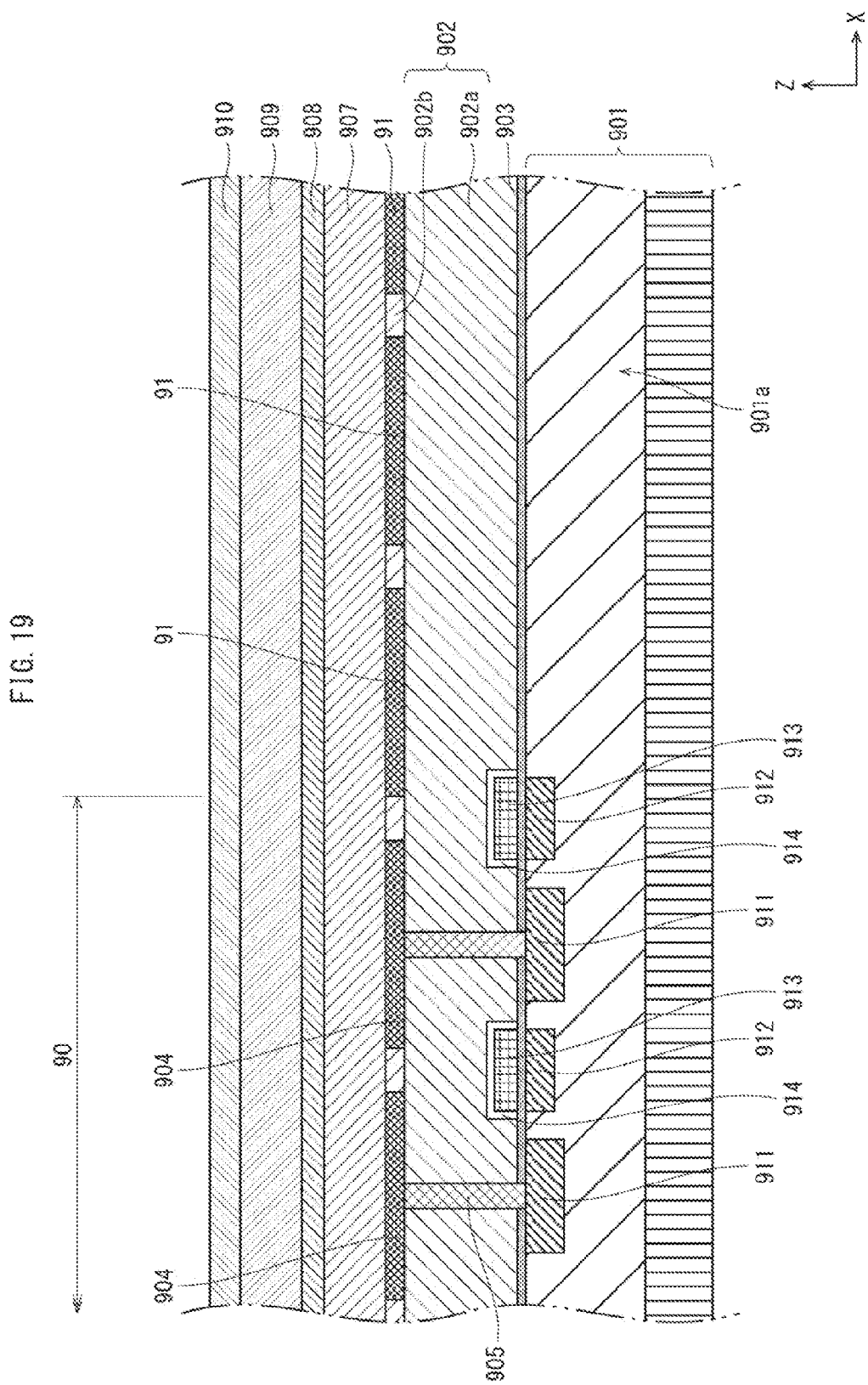

SOLID-STATE IMAGING APPARATUS AND METHOD FOR MANUFACTURING SAME

CROSS REFERENCE TO RELATED APPLICATION

This is a continuation application of PCI Application No. PCT/JP2012/004288 filed Jul 3, 2012, designating the United States of America, which in turn claims the benefit of Japanese Application No. 2011-169242, filed on Aug. 2, 2011, the disclosures of which, including the specification, drawings and claims, are incorporated herein by reference in their entirety.

TECHNICAL FIELD

The present disclosure relates to a solid-state imaging apparatus and a method for manufacturing the same. In particular, the present disclosure relates to a solid-state imaging apparatus which includes a photoelectric conversion layer above a substrate and a method for manufacturing the same.

DESCRIPTION OF THE RELATED ART

A solid-state imaging apparatus such as a CMOS sensor or a CCD sensor, which is for example provided in a digital camera, has a configuration including a plurality of photodiodes arranged a two dimensional array. In the past, typically each of the photodiodes was configured by forming a pn junction in a semiconductor substrate.

However, in recent years there has been a trend toward reducing pixel size in a solid-state imaging apparatus, due to an increase in the number of pixels included therein. Consequently, an amount of area occupied by each photodiode is also decreasing. Reducing the amount of area occupied by a photodiode is particularly problematic in terms of weakening photoelectric conversion properties of the photodiode, such as sensitivity, due to factors such as reduction in aperture ratio and reduction in light collection efficiency.

Also, when a photodiode, which is a photoelectric converter, is located in a semiconductor substrate made from silicon or the like, layers formed above the photodiode, for example for wiring, may reflect or scatter a portion of incident light. The above is for example problematic in terms of reduced sensitivity, due to loss of light, and also in terms of color-mixing, due to light becoming incident on a photodiode of an adjacent pixel.

In response to issues described above, a solid-state imaging apparatus has previously been proposed having a configuration in which a photoelectric conversion layer is located above a semiconductor substrate.

In a solid-state imaging apparatus such as described above, an insulating layer is layered above a semiconductor substrate and a plurality of pixel electrodes, one for each pixel, are located above the insulating layer. The pixel electrodes are covered by a photoelectric conversion layer and an opposing electrode is located above the photoelectric conversion layer. When light is incident on any of the pixels, an electrical charge is generated in the photoelectric conversion layer and the electrical charge is readout from the pixel by a corresponding readout circuit located in the semiconductor substrate.

Unfortunately, in a conventional solid-state imaging apparatus which includes a photoelectric conversion layer in a multi-layered structure, a steep step may occur between a pixel electrode, located below the photoelectric conversion layer, and the insulating layer at an edge of the pixel electrode. When a steep step occurs between the pixel electrode and the insulating layer, such as described above, the photoelectric conversion layer may become thinner than desired in a part corresponding to the steep step, resulting in defects such as cracks in the photoelectric conversion layer. When thinning occurs of the photoelectric conversion layer and a crack arises therein, the pixel electrode may come into direct contact with the opposing electrode, causing problems such as increased dark current, due to electrical field concentration, or a fault in the pixel, due to a short-circuit.

In response to the above problem, Patent Literature 1 proposes planarizing upper surfaces of a plurality of pixel electrodes using chemical mechanical polishing (CMP) in order to inhibit thinning of a photoelectric conversion layer and occurrence of cracks therein.

CITATION LIST

Patent Literature

[Patent Literature 1] Japanese Patent Publication No. 4444371

SUMMARY

Technical Problem

Unfortunately, when the art proposed in Patent Literature 1 is adopted, a problem occurs of thinning of pixel electrodes located in a peripheral part of a pixel region, which is configured by a plurality of pixels.

The inventors of the present disclosure discovered that the above problem arises during a step of planarization by CMP, which is performed when forming a plurality of pixel electrodes above an insulating layer. The inventors discovered that the above problem arises due to an excessively large step occurring in a surface of the insulating layer between a part of the insulating layer corresponding to a pixel region in which a plurality of metal films, for pixel electrode use, are formed from a metal material, and a part of the insulating layer corresponding to a more peripheral region in which metal films are not formed.

More specifically, the metal films are arranged on the part of the insulating layer corresponding to the pixel region, but are not arranged on the part of the insulating layer corresponding to the more peripheral region. Therefore, a large step occurs in the surface of the insulating layer when performing planarization using CMP. As a result, a problem occurs of thinning of pixel electrodes arranged in the peripheral part of the pixel region.

When film thickness of pixel electrodes arranged in the peripheral part of the pixel region becomes lower than film thickness of other pixel electrodes, problems occur such as decreased sensitivity, increased color-mixing and fluctuation in spectral properties.

In order to solve the above problem, the present disclosure aims to provide a solid-state imaging apparatus and a method for manufacturing the same which inhibits increase in dark current and occurrence of defective pixels caused by uneven photoelectric conversion layer thickness, and which also inhibits reduced sensitivity, increased color-mixing and fluctuations in spectral properties caused by uneven pixel electrode thickness.

Solution to Problem

In order to solve the above problem, one aspect of the present disclosure includes the following features.

A solid-state imaging apparatus relating to one aspect of the present disclosure comprises: a substrate; an insulating layer located above the substrate; a plurality of first electrodes located above the insulating layer in a pixel region and arranged in a two dimensional array with intervals therebetween; a second electrode covering the first electrodes in plan-view; a photoelectric conversion layer located between the second electrode and the first electrodes; a planarization support layer located above the insulating layer in a region that in plan-view is more peripheral than the pixel region; and a connecting electrode configured to apply an electrical voltage to the second electrode and located in a region that in plan-view is more peripheral than the region in which the planarization support layer is located, wherein the planarization support layer and the first electrodes are at a same layer level above the insulating layer.

Furthermore, the planarization support layer may also be located in a region that in plan-view is more peripheral than the connecting electrode.

Advantageous Effects

In the solid-state imaging apparatus relating to one aspect of the present disclosure, the planarization support layer is located above the insulating layer in a region that in plan-view is more peripheral than the pixel region (region in which the plurality of first electrodes are located) and more central than the connecting electrode. Also, the planarization support layer is located above the insulating layer at a same layer level as the first electrodes.

When manufacturing a solid-state imaging apparatus having a configuration such as described above, film thickness and smooth surfaces of all of the first electrodes can be ensured during formation of the photoelectric conversion layer. In other words, in the solid-state imaging apparatus of the present disclosure, the planarization support layer is located above the insulating layer in a region that in plan-view is more peripheral than the pixel region, and consequently the planarization support layer, which is located more peripherally than the first electrodes, functions as a dummy electrode when planarization is performed by CMP or the like. The above configuration prevents thinning of first electrodes located in a peripheral part of the pixel region.

As a consequence of the above, the solid-state imaging apparatus of the present disclosure inhibits increased dark current and occurrence of defective pixels caused by uneven photoelectric conversion layer thickness, and also inhibits reduced sensitivity, increased color-mixing and fluctuations in spectral properties caused by uneven pixel electrode thickness.

It is not essential that the planarization support layer be formed from the same conductive material as used to form the first electrodes, though in a configuration in which a metal material is used to form the planarization support layer, preferably copper (Cu), aluminum (Al), titanium (Ti), tantalum (Ta) or the like should be used.

BRIEF DESCRIPTION OF DRAWINGS

FIG. 7 illustrates, through ordered schematic process diagrams in sections (a) to (d), part of a process of manufacturing the solid-state imaging apparatus 1.

FIG. 8 is a plan-view schematic diagram illustrating arrangement of dummy layer portions 21 in a solid-state imaging apparatus relating to a first modified example.

FIG. 9 is a plan-view schematic diagram illustrating arrangement of dummy layer portions 31 in a solid-state imaging apparatus relating to a second modified example.

FIG. 14 illustrates, through ordered schematic process diagrams in sections (a) to (d), part of a process of manufacturing a solid-state imaging apparatus relating to a twelfth modified example.

FIG. 15 illustrates, through ordered schematic process diagrams in sections (a) to (c), part of a process of manufacturing a solid-state imaging apparatus relating to a second embodiment.

FIG. 17 illustrates, through ordered schematic process diagrams in sections (a) to (c), part of a process of manufacturing a solid-state imaging apparatus relating to a thirteenth modified example.

FIG. 19 is a cross-sectional schematic diagram illustrating configuration of one part of a solid-state imaging apparatus relating to a third embodiment.

DESCRIPTION OF EMBODIMENTS

[Embodiments of the Present Disclosure]

Figure 1:
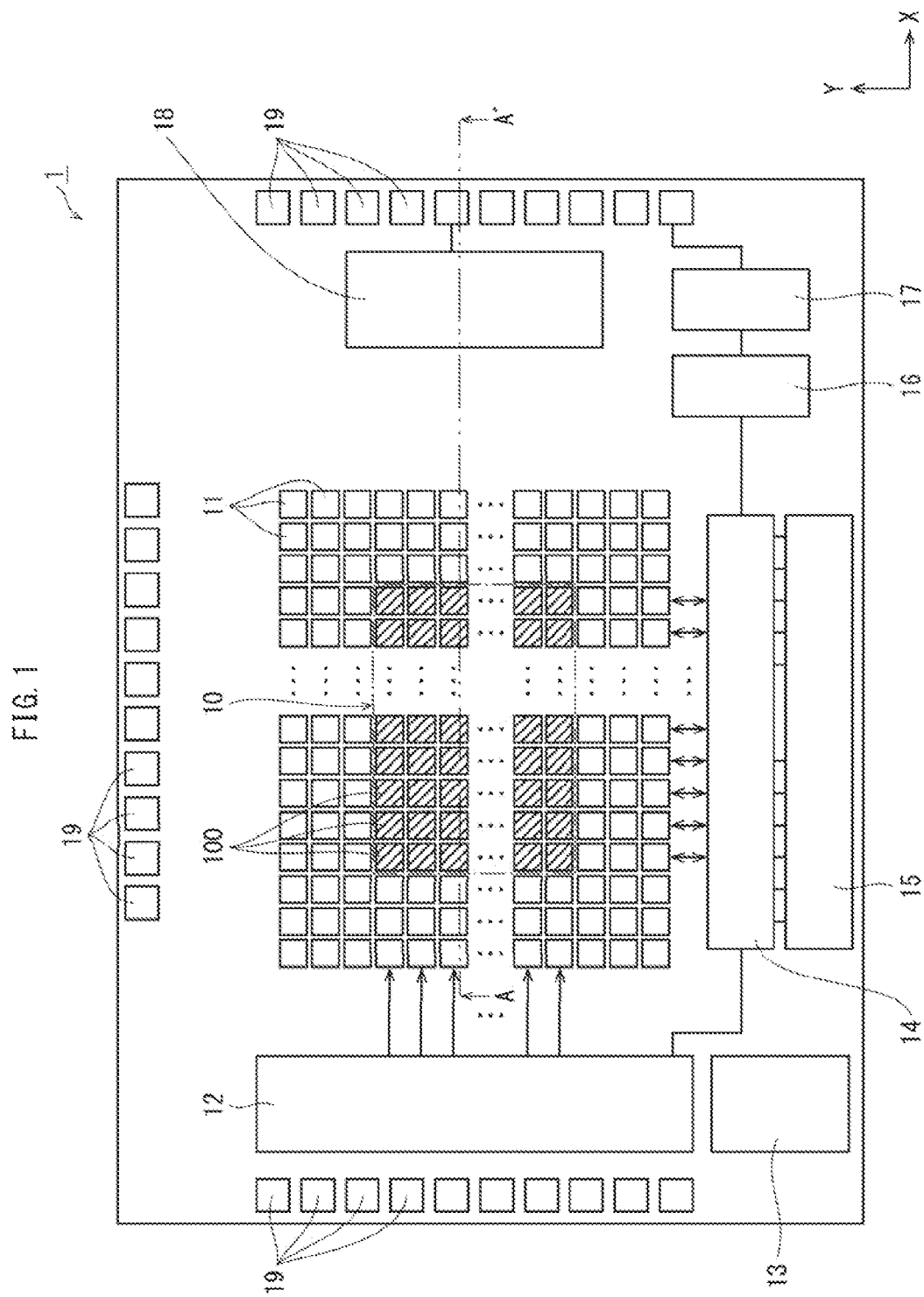
FIG. 1 is a plan-view schematic diagram illustrating configuration of a solid-state imaging apparatus 1 relating to a first embodiment of the present disclosure.

(1) A solid-state imaging apparatus relating to one aspect of the present disclosure comprises: a substrate; an insulating layer located above the substrate; a plurality of first electrodes located above the insulating layer in a pixel region and arranged in a two dimensional array with intervals therebetween; a second electrode covering the first electrodes in plan-view; a photoelectric conversion layer located between the second electrode and the first electrodes; a planarization support layer located above the insulating layer in a region that in plan-view is more peripheral than the pixel region; and a connecting electrode configured to apply an electrical voltage to the second electrode and located in a region that in plan-view is more peripheral than the region in which the planarization support layer is located, wherein the planarization support layer and the first electrodes are at a same layer level above the insulating layer.

Furthermore, the planarization support layer may also be located in a region that in plan-view is more peripheral than the connecting electrode.

In the solid-state imaging apparatus described in section (1), the planarization support layer is located above the insulating layer in a region that in plan-view is more peripheral than the pixel region (region in which the plurality of first electrodes are located) and more central than the connecting electrode. Also, the planarization support layer is located above the insulating layer at a same layer level as the first electrodes.

When manufacturing a solid-state imaging apparatus having a configuration such as described above, thickness and smooth surfaces of all the first electrodes can be ensured during formation of the photoelectric conversion layer. In other words, in the solid-state imaging apparatus of the present disclosure, the planarization support layer is located above the insulating layer in a region that in plan-view is more peripheral than the pixel region, and consequently the planarization support layer functions as a dummy electrode during planarization by CMP or the like. Thus, the above configuration prevents thinning of first electrodes located in a peripheral part of the pixel region.

Therefore, the solid-state imaging apparatus of the present disclosure inhibits increased dark current and occurrence of defective pixels caused by uneven photoelectric conversion layer thickness, and also inhibits reduced sensitivity, increased color-mixing and fluctuations in spectral properties caused by uneven pixel electrode thickness.

It is not essential that the planarization support layer be formed from the same conductive material as used to form the first electrodes, though in a configuration in which a metal material is used to form the planarization support layer, preferably Cu, Al, Ti, Ta or the like should be used.

The solid-state imaging apparatus relating to the one aspect of the present disclosure may adopt various alternative configurations such as described below.

(1-2) In the solid-state imaging apparatus described in section (1), the planarization support layer may be composed of a plurality of planarization support layer portions that are arranged above the insulating layer with intervals therebetween. Through a configuration such as described above, in which the planarization support layer is composed of a plurality of planarization support layer portions, an approximately even surface can be achieved in the pixel region and in the more peripheral region in which the planarization support layer portions are located, during planarization by CMP or the like. Therefore, the above configuration enables even higher precision control of film thickness and smooth surfaces of the first electrodes in the peripheral part of the pixel region.

(1-3) In the solid-state imaging apparatus described in section (1-2), the planarization support layer portions may be arranged such as to surround an entire periphery of the pixel region. In the above configuration, the planarization support layer portions surround the entire periphery of the pixel region as opposed to just one section of the periphery. Therefore, the above configuration enables even higher precision control of film thickness and smooth surfaces of all of the first electrodes in the peripheral part of the pixel region.

(1-Va-3') In the solid-state imaging apparatus described in section (1-2) or (1-3), the first electrodes may be arranged in a matrix and may each have an oblong shape of size $L_1 \times L_2$ in plan-view, and the planarization support layer portions may be located in a region extending for a range of at least $5 \times L_1$ or $5 \times L_2$ from a periphery of the pixel region, in which the first electrodes are located. Defining a range, such as described above, enables high precision control of film thickness and smooth surfaces of the first electrodes in the pixel region.

(1-4) In the solid-state imaging apparatus described in section (1-2) or (1-3), each of the planarization support layer portions may be equal to each of the first electrodes in terms of shape and size, and the intervals between the planarization support layer portions may be equal to the intervals between the first electrodes. The above configuration is preferable in order for the planarization support layer portions to function as dummies for the first electrodes during planarization by CMP or the like. Therefore, the above configuration enables high precision control of film thickness and smooth surfaces of the first electrodes in the peripheral part of the pixel region.

(1-5) In the solid-state imaging apparatus described in any of sections (1-2) to (1-4), and (1-Va-3'), the planarization support layer portions may be arranged such as to at least triply surround an entire periphery of the pixel region. A configuration such as described above, in which the planarization support layer portions at least triply surround the periphery of the pixel region, ensures high precision control of film thickness and smooth surfaces of the first electrodes in the peripheral part of the pixel region.

(1-Va-5') In the solid-state imaging apparatus described in any of sections (1-2) to (1-5), and (1-Va-3'), a percentage area $A_1$ occupied by the first electrodes in the pixel region in which the first electrodes are located and a percentage area $A_2$ occupied by the planarization support layer portions in the region in which the planarization support layer portions are located, may satisfy a relation $(0.5 \times A_1) \leq A_2 \leq (1.5 \times A_1)$.

A configuration such as described above, in which the percentage area $A_2$ occupied by the planarization support layers is in a range of 0.5 to 1.5 times the percentage area $A_1$ occupied by the first electrodes in the pixel region, enables a high degree of smoothness of the first electrodes throughout the pixel region, during planarization by CMP. $A_2$ is a percentage of area which is occupied and therefore is a value greater than 0% and less than 100%.

(1-6) In the solid-state imaging apparatus described in any of sections (1-2) to (1-5), (1-Va-3'), and (1-Va-5'), the insulating layer may extend into an interval between each two of the first electrodes which are adjacent to one another, the insulating layer extending to a position that is higher than lower surfaces of the two first electrodes and lower than upper surfaces of the two first electrodes.

(1-7) In the solid-state imaging apparatus described in any of sections (1-2) to (1-6), (1-Va-3'), and (1-Va-5'), the planarization support layer and the first electrodes may be made from similar metal materials. In a configuration such as described above, in which the first electrodes and the planarization support layer portions are made from similar metal materials, during planarization by CMP or the like, polishing conditions in the pixel region and polishing conditions in the more peripheral region, in which the planarization support layer portions are located, are more similar than in a configuration in which the first electrodes and the planarization support layer portions are made from different materials. Therefore, the above configuration enables higher precision control of film thickness and smooth surfaces of the first electrodes in the peripheral part of the pixel region.

Furthermore, a configuration such as described above, in which the first electrodes and the planarization support layer portions are made from similar metal materials, enables reduction in time, cost and number of process steps during manufacture, compared to a configuration in which the first electrodes and the planarization support layers are made from different materials.

(1-8) In the solid-state imaging apparatus described in any of sections (1-2) to (1-7), (1-Va-3'), and (1-Va-5'), the planarization support layer may be made from a metal material including at least one selected from the group consisting of Cu, Al, Ti, Ta and W. A configuration such as described above, in which the planarization support layer is made from a metal material including at least one of Cu, Al, Ti, Ta and tungsten (W), enables high precision control of film thickness and smooth surfaces of the first electrodes in the peripheral part of the pixel region during planarization by CMP or the like. The above effect is due to similarity of the aforementioned metal materials to metal materials (for example, Ti, Al, Ta, titanium nitride (TiN) or tantalum nitride (TaN)), which may typically be used to form the first electrodes.

(1-9) The solid-state imaging apparatus described in any of sections (1-2) to (1-8), (1-Va-3'), and (1-Va-5'), may further comprise a drive control circuit configured to perform input and output of signals with respect to the first electrodes and the second electrode, the drive control circuit being located in at least one of the substrate and the insulating layer, in a region that in plan-view is more peripheral than the pixel region, wherein the planarization support layer may be light-blocking and may cover the drive control circuit in plan-view. In a configuration in which the planarization support layer is located as described above, the planarization support layer can function as a light-blocking film which prevents external light from being incident on the drive control circuit. Imaging ability of the solid-state imaging apparatus can be further improved by blocking external light as described above.

(1-10) In the solid-state imaging apparatus described in section (1-9), the planarization support layer may be at least partially composed of a plurality of planarization support layer portions arranged above the insulating layer with intervals therebetween, in a region corresponding to the drive control circuit, each of the first electrodes and each of the plurality of planarization support layer portions may have an oblong shape in plan-view, and at least one side of each of the planarization support layer portions may be at least three times as long as a correspondingly orientated side of each of the first electrodes. The configuration described above enables high precision control of film thickness and smooth surfaces of the first electrodes in the peripheral part of the pixel region during planarization by CMP, and also enables external light to be effectively prevented from reaching the drive control circuit.

(1-Va-10') In the solid-state imaging apparatus described in section (1-10), the plurality of planarization support layer portions, located in the region that is above the insulating layer and that corresponds to the drive control circuit, may each have a size $L_3 \times L_4$, wherein at least one of $L_3$ and $L_4$ is greater than or equal to 100 μM. The above configuration enables external light to be effectively prevented from reaching the drive control circuit.

(1-11) In the solid-state imaging apparatus described in any of sections (1) to (1-10), (1-Va-3'), (1-Va-5'), and (1-Va-10'), the planarization support layer may not be electrically connected to the first electrodes, the second electrode or the photoelectric conversion layer. In the solid-state imaging apparatus relating to the one aspect of the present disclosure, a configuration such as described above may be adopted in which the planarization support layer is not electrically connected to the first electrodes, the second electrode or the photoelectric conversion layer, but alternatively a configuration may be adopted in which the planarization support layer is electrically connected to the first electrodes, the second electrode or the photoelectric conversion layer.

(1-12) The solid-state imaging apparatus described in any of sections (1) to (1-11), (1-Va-3'), (1-Va-5'), and (1-Va-10') may further comprise a plug located below the planarization support layer and passing through the insulating layer, wherein the planarization support layer may be connected to the plug. In the above configuration, in which the planarization support layer is connected to the plug located below the planarization support layer, configuration of the planarization support layer is more similar to configuration of the first electrodes, which are each connected to a plug. Therefore, the above configuration enables higher precision control of film thickness and smooth surfaces of the first electrodes in the peripheral part of the pixel region during planarization by CMP.

(1-Va-12') In the solid-state imaging apparatus described in section (1-12), the insulating layer may have a layered structure including a plurality of configuration sub-layers which are layered from a side closest to the substrate, an opposing layer may be located such that an uppermost sub-layer of the insulating layer is sandwiched between the planarization support layer and the opposing layer in terms of a thickness direction of the uppermost sub-layer, and the planarization support layer may be connected to the opposing layer by a plug which passes through the uppermost sub-layer. In a configuration such as described above, configuration of the planarization support layer and other elements connected thereto is more similar to configuration of the first electrodes in the pixel region and other elements connected thereto. Therefore, the above configuration enables higher precision control of film thickness and smooth surfaces of the first electrodes in the peripheral part of the pixel region during planarization by CMP.

(1-13) In the solid-state imaging apparatus described in any of sections (1) to (1-12), (1-Va-3'), (1-Va-5'), (1-Va-10'), and (1-Va-12'), each of the first electrodes may include at least one selected from the group consisting of TiN, Ti, Al, Ta, TaN, Cu and W.

(1-14) The solid-state imaging apparatus described in any of sections (1) to (1-13), (1-Va-3'), (1-Va-5'), (1-Va-10'), and (1-Va-12'), may further comprise a plurality of readout circuits configured to readout an electrical charge signal generated in the photoelectric conversion layer, the readout circuits being located in at least one of the substrate and the insulating layer in one-to-one correspondence with the first electrodes, wherein each of the first electrodes may be electrically connected to a corresponding one of the readout circuits.

(2) A method for manufacturing a solid-state imaging apparatus relating to one aspect of the present disclosure comprises: a step (a) of preparing a substrate; a step (b) of layering an insulating layer above the substrate; a step (c) of forming a plurality of metal films, for first electrode use, above the insulating layer in a pixel region, the metal films being formed in a two dimensional array with intervals therebetween; a step (d) of forming a planarization support layer above the insulating layer in a region that in plan-view is more peripheral than the pixel region; a step (e) of forming an insulating material layer over upper surfaces of the metal films and the planarization support layer, and also over the insulating layer in the intervals between the metal films; a step (f) of polishing the insulating layer, the insulating material layer, the metal films and the planarization support layer by performing chemical mechanical polishing; a step (g) of forming a photoelectric conversion layer such as to entirely cover a plurality of first electrodes which are formed by the polishing of the metal films; a step (h) of forming a second electrode above the photoelectric conversion layer; and a step (i) of forming a connecting electrode, configured to apply an electrical voltage to the second electrode, above the insulating layer in a region that in plan-view is more peripheral than the planarization support layer, wherein the planarization support layer and the first electrodes are at a same layer level above the insulating layer.

Alternatively, the planarization support layer may also be formed in a region that in plan-view is more peripheral than the connecting electrode.

In the method for manufacturing a solid-state imaging apparatus described in section (2), planarization by CMP in step (f) is performed after the planarization support layer is formed in step (d), and after the insulating material layer is formed in step (e). Therefore, the method described in section (2) enables high precision control, during planarization, of film thickness and smooth surfaces of all of the metal films, even metal films which are formed in a peripheral part of the pixel region in which the first electrodes (the metal films prior to step (f)) are to be formed. In other words, forming the planarization support layer, which acts as a dummy layer, peripherally to the pixel region, ensures that there is almost no step in an upper surface of the insulating layer at a boundary between the pixel region and the region that is more peripheral than the pixel region, which is related to polishing of the metal films in the peripheral part of the pixel region. Thus, the method described in section (2) enables high precision control of film thickness and smooth surfaces of the metal films during planarization.

(3) A method for manufacturing a solid-state imaging apparatus relating to one aspect of the present disclosure comprises: a step (a) of preparing a substrate; a step (b) of layering an insulating layer above the substrate; a step (c) of forming, in the insulating layer, a plurality of first recesses that are arranged in a two dimensional array and a second recess that in plan-view is formed more peripherally than the first recesses; a step (d) of forming a metal film covering the insulating layer such that side and bottom surfaces inside each of the first recesses and the second recess are also covered by the metal film; a step (e) of performing chemical mechanical polishing on the insulating layer and the metal film, such that a portion of the metal film remaining in each of the first recesses forms a first electrode and a portion of the metal film remaining in the second recess forms a planarization support layer; a step (f) of forming a photoelectric conversion layer such as to entirely cover the first electrodes; a step (g) of forming a second electrode above the photoelectric conversion layer; and a step (h) of forming a connecting electrode, configured to apply an electrical voltage to the second electrode, above the insulating layer in a region that in plan-view is more peripheral than the planarization support layer, wherein the planarization support layer and the first electrodes are at a same layer level above the insulating layer.

In the method for manufacturing a solid-state imaging apparatus described in section (3), planarization by CMP is performed in step (e), after the metal film is formed in step (d) covering the insulating layer such that the side and bottom surfaces inside the first recesses and the second recess are also covered by the metal film. Therefore, the method described in section (3) enables high precision control, during planarization, of film thickness and smooth surfaces of first electrodes which are formed, after polishing, in a peripheral part of a region which is to form a pixel region (region in which the first recesses are formed).

Therefore, the methods for manufacturing a solid-state imaging apparatus described in sections (2) and (3) inhibit increase in dark current and occurrence of defective pixels caused by uneven photoelectric conversion layer thickness, and also inhibit reduced sensitivity, increased color-mixing and fluctuations in spectral properties caused by uneven pixel electrode thickness.

In the methods for manufacturing a solid-state imaging apparatus described in sections (2) and (3), the planarization support layer and the first electrodes are formed at a same layer level above the insulating layer. Also, in the method for manufacturing a solid-state imaging apparatus described in section (2), it is not essential that the planarization support layer is formed from the same conductive material as used to form the first electrodes, though in a method in which the planarization support layer is formed from a metal material, preferably Cu, Al, Ti, Ta or the like should be used.

Each of the methods for manufacturing a solid-state imaging apparatus relating to one aspect of the present disclosure may adopt various alternative configurations such as described below.

(2-Va-2) In the method for manufacturing a solid-state imaging apparatus described in section (2) or (3), the planarization support layer may be composed of a plurality of planarization support layer portions that are arranged above the insulating layer with intervals therebetween, such as to substantially surround, in plan-view, an entire periphery of a region in which the first electrodes are formed. By forming the plurality of planarization support layer portions such as surround the entire periphery of the region which is to be the pixel region, the above configuration enables high precision control, during planarization by CMP or the like, of film thickness and smooth surfaces of first electrodes in the peripheral part of the pixel region, in the same way as described above.

(2-Va-3) In the method for manufacturing a solid-state imaging apparatus described in section (2-Va-2), the first electrodes may each have an oblong shape of size $L_1 \times L_2$ in plan-view, and the planarization support layer portions may be formed in a region extending for a range of at least $5 \times L_1$ or $5 \times L_2$ from a periphery of the region in which the first electrodes are located (pixel region). The above configuration enables high precision control of film thickness and smooth surfaces of the first electrodes in the pixel region.

(2-Va-4) In the method for manufacturing a solid-state imaging apparatus described in section (2-Va-2) or (2-Va-3), each of the planarization support layer portions may be equal to each of the first electrodes in terms of shape and size, and the intervals between the planarization support layer portions may be equal to the intervals between the first electrodes. The above configuration is preferable in order that the planarization support layer portions function as dummies for the first electrodes during planarization by CMP or the like. Therefore, the above configuration enables high precision control of film thickness and smooth surfaces of first electrodes in a peripheral part of the pixel region.

(2-Va-5) In the method for manufacturing a solid-state imaging apparatus described in any of sections (2-Va-2) to (2-Va-4), the planarization support layer portions may be arranged such as to at least triply surround the entire periphery of the pixel region. A configuration such as described above, in which the planarization support layer portions at least triply surround the periphery of the pixel region, enables high precision control of film thickness and smooth surfaces of first electrodes in the peripheral part of the pixel region.

(2-Va-6) In the method for manufacturing a solid-state imaging apparatus described in any of sections (2-Va-2) to (2-Va-5), a percentage area $A_1$ occupied by the first electrodes in the pixel region in which the first electrodes are formed and a percentage area $A_2$ occupied by the planarization support layer portions in a region in which the planarization support layer portions are formed, may satisfy a relation $(0.5 \times A_1) \leq A_2 \leq (1.5 \times A_1)$.

A configuration such as described above, in which the percentage area $A_2$ occupied by the planarization support layer portions is in a range of 0.5 to 1.5 times the percentage area $A_1$ occupied by the first electrodes in the pixel region, enables high precision control of film thickness and smooth surfaces of the first electrodes throughout the entire pixel region during planarization by CMP or the like.

As explained above, $A_2$ is a percentage of area which is occupied and therefore is a value greater than 0% and less than 100%.

(2-Va-7) In the method for manufacturing a solid-state imaging apparatus described in any of sections (2), (3), and (2-Va-2) to (2-Va-6), the planarization support layer may not be electrically connected to the first electrodes or the second electrode. As explained above, in the present disclosure a configuration may be adopted in which the planarization support layer is not electrically connected to the first electrodes, the second electrode or the photoelectric conversion layer, but alternatively a configuration may be adopted in which the planarization support layer is electrically connected to the first electrodes, the second electrode or the photoelectric conversion layer.

(2-Va-8) In the method for manufacturing a solid-state imaging apparatus described in any of sections (2), (3), and (2-Va-2) to (2-Va-7), the planarization support layer and the first eletrodes may be made from similar metal materials. Through a configuration such as described above, in which the first electrodes and the planarization support layer are formed from similar metal materials, during planarization by CMP or the like, the surface of the insulating layer is more even and has almost no step between the pixel region and the more peripheral region in which the planarization support layer is formed, compared to in a configuration where the first electrodes and the planarization support layer are formed from different materials. Therefore, the above configuration enables higher precision control of film thickness and smooth surfaces of first electrodes in the peripheral part of the pixel region.

Furthermore, the configuration described above, in which the first electrodes and the planarization support layer are formed from similar metal materials, enables reduction in time, cost and number of process steps during manufacture, compared to a configuration in which the first electrodes and the planarization support layer are formed from different materials.

(2-Va-9) In the method for manufacturing a solid-state imaging apparatus described in any of sections (2), (3), and (2-Va-2) to (2-Va-8), the photoelectric conversion layer may be formed such as to extend into an interval between each two of the first electrodes which are adjacent to one another, the photoelectric conversion layer extending to a position that is lower than upper surfaces of the two first electrodes and higher than lower surfaces of the two first electrodes.

(Va-4) A method for manufacturing a solid-state imaging apparatus relating to one aspect of the present disclosure comprises: a step (a) of preparing a substrate; a step (b) of layering an insulating layer above the substrate; a step (c) of forming a plurality of metal films, for first electrode use, above the insulating layer in a pixel region, the metal films being formed in a two dimensional array with intervals therebetween; a step (d) of forming an insulating material layer over upper surfaces of the metal films and also over the insulating layer in the intervals between the metal films; a step (e) of planarizing an upper surface of the insulating material layer such as to remove protruding parts of the insulating material layer in locations corresponding to the metal films; a step (f) of polishing the insulating material layer and the metal films by chemical mechanical polishing; a step (g) of forming a photoelectric conversion layer such as to entirely cover a plurality of first electrodes which are formed by the polishing of the metal films; and a step (h) of forming a second electrode above the photoelectric conversion layer.

In the method for manufacturing a solid-state imaging apparatus described in section (Va-4), a planarization support layer is not formed as in the methods described in sections (2) and (3). However, planarization by CMP performed in step (f) is performed after planarization of the upper surface of the insulating material layer is performed in step (e), during which protruding parts of the insulating material layer in locations corresponding to the metal films are removed. Therefore, the method described in (Va-4) enables high precision control of film thickness and smooth surfaces of the first electrodes in a peripheral part of a region which is to form a pixel region.

(Va-5) A method for manufacturing a solid-state imaging apparatus relating to one aspect of the present disclosure comprises: a step (a) of preparing a substrate; a step (b) of layering an insulating layer above the substrate; a step (c) of forming a plurality of recesses in the insulating layer in a two dimensional array; a step (d) of forming a metal film covering the insulating layer such that side and bottom surfaces inside each of the recesses are also covered by the metal film; a step (e) of planarizing an upper surface of the metal film such as to remove protruding parts of the metal film in locations corresponding to intervals between the recesses; a step (f) of polishing the metal film and the insulating layer by chemical mechanical polishing such that a portion of the metal film remaining in each of the recesses forms a first electrode; a step (g) of forming a photoelectric conversion layer such as to entirely cover the first electrodes; and a step (h) of forming a second electrode above the photoelectric conversion layer.

In the method for manufacturing a solid-state imaging apparatus described in section (Va-5), in the same way as in the method described in section (Va-4), a planarization support layer is not formed. However, planarization by CMP is performed in step (f) after the metal film is formed in step (d) covering the side and bottom surfaces inside each of the recesses in the insulating layer, and after protruding parts of the metal film in locations corresponding to intervals between the recesses are removed in step (e). Therefore, the method described in section (Va-5) enables high precision control of film thickness and smooth surfaces of the first electrodes in a peripheral part of a region which is to form a pixel region.

Therefore, the methods described in sections (Va-4) and (Va-5) enable manufacture of a solid-state imaging apparatus in which increased dark current and occurrence of defective pixels, caused by uneven photoelectric conversion layer thickness, are inhibited, and in which reduced sensitivity, increased color-mixing and fluctuations in spectral properties, caused by uneven pixel electrode thickness, are also inhibited.

Furthermore, in the method for manufacturing a solid-state imaging apparatus described in section (Va-4) or (Va-5), in step (e) a reverse mask may be used which has apertures formed in locations corresponding to the protruding parts which are to be removed.

The following explains, with reference to the drawings, embodiments of the present disclosure. Each of the embodiments explained below is provided as an example in order to facilitate understanding of configurations and effects thereof in the present disclosure. The present disclosure is not limited by the embodiments explained below, except with regards to elements which are fundamental features of the present disclosure.

[First Embodiment]

1. Overall Configuration of Solid-state Imaging Apparatus 1

The following explains, with reference to FIG. 1, overall configuration of a solid-state imaging apparatus 1 relating to a first embodiment of the present disclosure. FIG. 1 is a plan-view schematic diagram illustrating configuration of the solid-state imaging apparatus 1 relating to the first embodiment.

As illustrated in FIG. 1, the solid-state imaging apparatus 1 includes a plurality of pixels 100 which are located in a central region. The pixels 100 are arranged in a matrix in an X-axis direction and a Y-axis direction. The pixels 100 configure a pixel region 10. A dummy layer composed of a plurality of dummy layer portions 11 is located in a region that, in plan-view (i.e., viewing FIG. 1 perpendicularly to a plane on which FIG. 1 is illustrated), is more peripheral than the pixel region 10. The dummy layer portions 11 are arranged such as to surround an entire periphery of the pixel region 10. More detailed explanation of the above is provided further below.

A vertical driver 12, a timing generator 13, a signal processing circuit 14, a horizontal driver 15, low voltage differential signalling (LVDS) unit 16, a serial converter 17 and an opposing electrode voltage supplier 18 are each located in a region that, in plan-view, is more peripheral than the region in which the dummy layer portions 11 are located. The solid-state imaging apparatus 1 also includes a plurality of pads 19. A plurality of readout circuits (not illustrated in FIG. 1) are located in the pixel region 10 in one-to-one correspondence with the pixels 100.

The vertical driver 12 performs control of readout of signals from the readout circuits provided in correspondence to the pixels 100 in the pixel region 10.

The timing generator 13 generates and supplies a timing used to drive the solid-state imaging apparatus 1, and performs readout control such as thinning readout or partial readout. The signal processing circuit 14 is provided in correspondence to each column of the readout circuits which correspond to the pixels 100. The signal processing circuit 14 performs correlated double sampling (CDS) with regards to a signal output from a corresponding column and converts the signal on which processing has been performed to generate a digital signal. The digital signal is stored in a corresponding memory among memories provided in correspondence with the columns.

The horizontal driver 15 performs control to read, in order, a signal for each row stored in the memory of the signal processing circuit 14, and output the signal to the LVDS unit 16. The LVDS unit 16 transfers a digital signal according to LVDS. The serial converter 17 converts an input parallel digital signal into a serial digital signal and outputs the serial digital signal.

Alternatively, the serial converter 17 may be omitted. Also, alternatively a configuration is possible in which the LVDS unit 16 is replaced by an AD conversion circuit and only CDS processing is performed.

Further alternatively, a configuration is possible in which both the LVDS unit 16 and the serial converter 17 are omitted, and in which only CDS processing is performed in the signal processing circuit 14. In a configuration such as described above, an AD conversion circuit may be provided externally to a chip on which the solid-state imaging apparatus 1 is formed.

A configuration may alternatively be adopted in which the signal processing circuit 14, the LVDS unit 16 and the serial converter 17 are provided in both a region adjacent to the pixel region 10 at one side thereof and a region adjacent to the pixel region 10 at another side thereof. In a configuration such as described above, among columns of the readout circuits which are provided in correspondence with the pixels 100 in the pixel region 10, the signal processing circuit 14 located in the region at the one side of the pixel region 10 may execute processing with regards to half of the columns (for example, odd number columns), and the signal processing circuit 14 located in the region at the other side of the pixel region 10 may execute processing with regards to the remaining half of the columns (for example, even number columns).

2. Detailed Description of Configuration of One Part of Solid-state Imaging Apparatus 1

Figure 2:
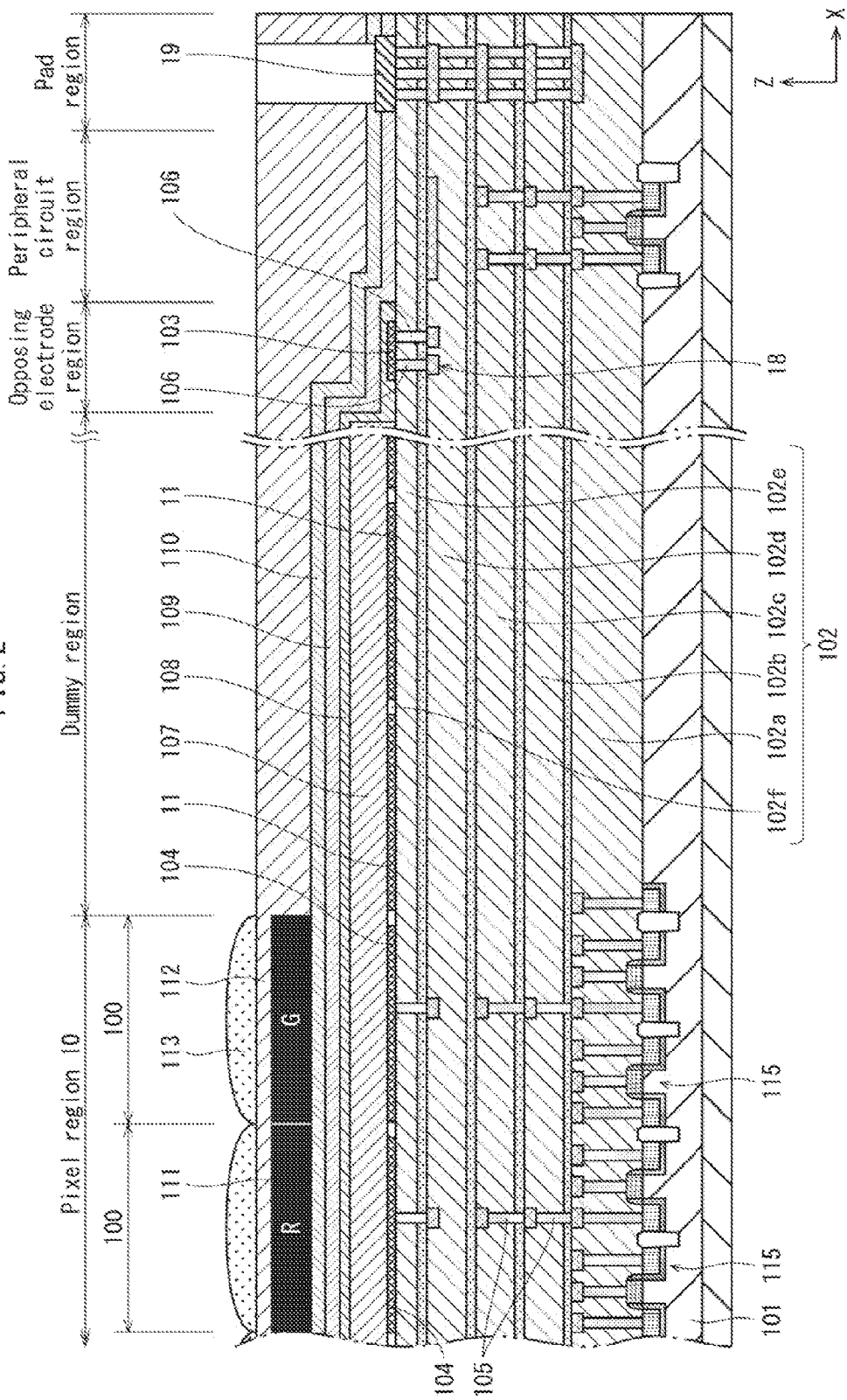
FIG. 2 is a cross-sectional schematic diagram illustrating configuration of one part of the solid-state imaging apparatus 1.
Figure 3:
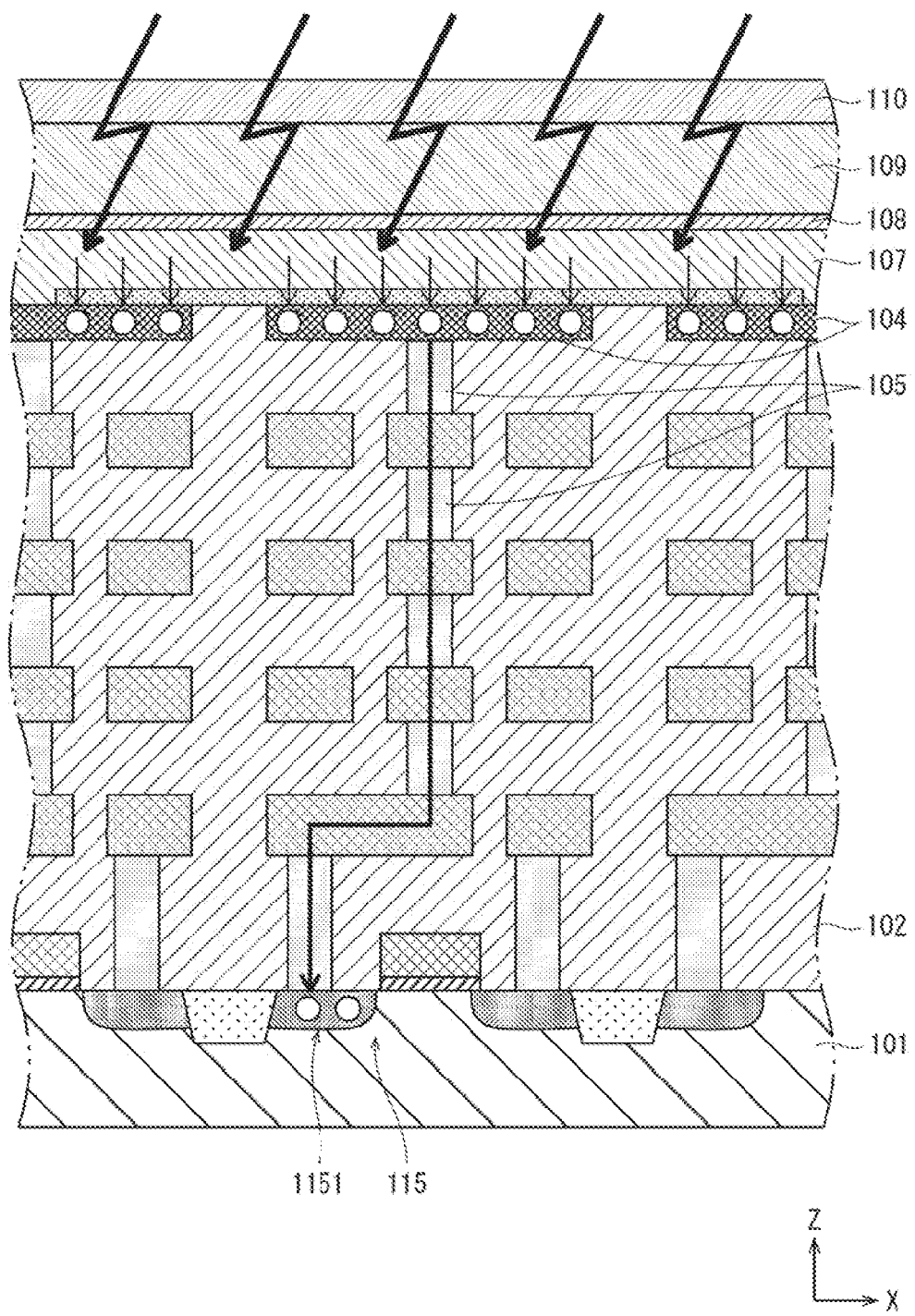
FIG. 3 is a cross-sectional schematic diagram illustrating configuration of one part of a pixel region 10 in the solid-state imaging apparatus 1.

The following explains in detail, with reference to FIGS. 2 and 3, configuration of one part of the solid-state imaging apparatus 1. FIG. 2 is a cross-sectional schematic diagram illustrating configuration of one part of the solid-state imaging apparatus 1. FIG. 3 is a cross-sectional schematic diagram illustrating one part of the pixel region 10 of the solid-state imaging apparatus 1.

As illustrated in FIG. 2, the solid-state imaging apparatus 1 includes a substrate 101 and an insulating layer 102 which is located above the substrate 101, and which is composed of a plurality of configuration sub-layers 102a-102f. The solid-state imaging apparatus 1 also includes a plurality of readout circuits 115 located in the pixel region 10 in one-to-one correspondence with the pixels 100. The readout circuits 115 are located in the substrate 101 and the insulating layer 102. A plurality of pixel electrodes 104 are located on a main surface of the insulating layer 102 which is located at an upper side thereof in terms of a Z-axis direction (i.e., an upper surface of the insulating layer 102). Each of the pixel electrodes 104 is connected to a corresponding one of the readout circuits 115 via a connector 105.

In the pixel region 10, the configuration sub-layer 102f of the insulating layer 102 is located in intervals between each two of the pixel electrodes 104 that are adjacent to one another. Also, the pixel electrodes 104 are equal in terms of film thickness, and a main surface of each of the pixel electrodes 104 at an upper side thereof in terms of the Z-axis direction (i.e., an upper surface of the pixel electrode 104) is planarized.

A photoelectric conversion layer 107 is layered above the pixel electrodes 104 and the configuration sub-layer 102f of the insulating layer 102. An opposing electrode 108, a buffering layer 109 and a sealing layer 110 are layered in respective order above the photoelectric conversion layer 107. A plurality of color filters 111 are located above the sealing layer 110 in one-to-one correspondence with the pixels 100. Each of the color filters 111 transmits light in a wavelength band in accordance with the corresponding pixel 100. A plurality of micro-lenses 113 are located above the color filters 111 in one-to-one correspondence, and a planarizing layer 112 is located between the color filters 111 and the micro-lenses 113.

The substrate 101 is for example a glass substrate or a semiconductor substrate made from silicon (Si) or the like. The configuration sub-layers 102a-102f which configure the insulating layer 102 are for example made from silicon oxide ($SiO_2$). The pixel electrodes 104 are electrodes for collecting electrical charge generated in the photoelectric conversion layer 107. The pixel electrodes 104 are for example made from tin nitride (TiN).

The photoelectric conversion layer 107 is a layer which generates electrical charge in response to incident light. Even film thickness of the photoelectric conversion layer 107 is important above the pixel electrodes 104 in the pixel region 10, but in other regions uneven film thickness of the photoelectric conversion layer 107 is not problematic.

The opposing electrode 108 is an electrode which is located in opposition to the pixel electrodes 104, and which transmits light to the photoelectric conversion layer 107. Therefore, the opposing electrode 108 is made from a light-transmitting conductive material such as indium tin oxide (ITO) or indium zinc oxide (IZO). The opposing electrode 108 is connected to a connecting electrode 103 in an opposing electrode region. The connecting electrode 103 is electrically connected to the opposing electrode voltage supplier 18 via a connector 106.

The connectors 105 and 106 pass through the configuration sub-layers 102a-102e of the insulating layer 102. Each of the connectors 105 is electrically connected to the pixel electrode 104 of a corresponding pixel 100 and also to the readout circuit 115 corresponding to the pixel electrode 104. The connector 106 is electrically connected to the opposing electrode 103 and the opposing electrode voltage supplier 18. The connectors 105 and 106 are each formed through implantation of a conductive material such as W.

The readout circuits 115 located in the substrate 101 correspond one-to-one with the pixel electrodes 104. Each of the readout circuits 115 is a circuit that performs readout of a signal in response to electrical charge collected from the corresponding pixel electrode 104. Each of the readout circuits 115 is for example a MOS circuit or a TFT circuit. Light is blocked from reaching the readout circuits 115 by a light-blocking layer (not illustrated in the drawings) that is for example located in the insulating layer 102.

The pixel electrodes 104 are arranged in a two dimensional array (i.e., arranged in a matrix) in the X-axis direction and the Y-axis direction (i.e., perpendicular to a plane which is illustrated in FIG. 2) on the upper surface of the insulating layer 102. The pixel electrodes 104 are arranged with intervals of fixed size therebetween. The pixel electrodes 104 are arranged in accordance with arrangement of the pixels 100 illustrated in FIG. 1.

Although not illustrated in the drawings, a light-blocking layer is located above the sealing layer 110 in regions in which the color filters 111 are not located. The light-blocking layer blocks external light in regions other than in an effective pixel region, and thus prevents light from being incident on the photoelectric conversion layer 107 in regions other than the effective pixel region.

Returning to explanation of FIG. 2, a dummy region is located peripherally to the pixel region 10. As explained above, a plurality of dummy layer portions 11 are located in the dummy region on the upper surface of the insulating layer 102. In other words, the dummy layer portions 11 are located at the same layer level as the pixel electrodes 104. In the present embodiment, the dummy layer portions 11 are made from the same metal material as the pixel electrodes 104, and are not electrically connected to other circuits or the like in the solid-state imaging apparatus 1. The photoelectric conversion layer 107, the opposing electrode 108, the buffering layer 109 and the sealing layer 110 are layered in respective order above the dummy layer portions 11 in the same way as described for the pixel region 10.

The configuration sub-layer 102f of the insulating layer 102 is also located in intervals between each two of the dummy layer potions 11 that are adjacent to one another. The above configuration is the same as described for the pixel region 10 in which the pixel electrodes 104 are located.

The opposing electrode region, in which the opposing electrode 108 is electrically connected to the connecting electrode 103 as described above, is located more peripherally than the dummy region. The connecting electrode 103 is electrically connected to the opposing electrode voltage supplier 18, located below the configuration sub-layer 102e, via the connector 106 which passes through the configuration sub-layer 102e. Note that FIG. 2 only illustrates one part of configuration of the opposing electrode voltage supplier 18.

As illustrated in FIGS. 1 and 2, the present embodiment is an example of a configuration including one grouping composed of the opposing electrode 103, the connector 106 and the opposing electrode voltage supplier 18, but alternatively a configuration including a plurality of the aforementioned groupings may be adopted. An appropriate number of the aforementioned groupings can be determined in consideration of factors such as chip area and wiring width in the solid-state imaging apparatus.

A peripheral circuit region and a pad region are located more peripherally than the opposing electrode region. A recess is located in the pad region which extends in a downwards direction as far as an upper surface of the configuration sub-layer 102d of the insulating layer 102. A pad 19 is located on a bottom surface inside the recess. Although not illustrated in the drawings, the pad 19 is electrically connected to circuits such as a signal input-output circuit and a circuit for supplying electrical voltage. A metal layer made from Cu or the like is located in the peripheral circuit region.

The following explains a mechanism of imaging with reference to FIG. 3.

As illustrated in FIG. 3, light incident from above along the Z-axis passes through the sealing layer 110, the buffering layer 109 and the opposing electrode 108, and is incident on the photoelectric conversion layer 107. An appropriate bias voltage is applied to the photoelectric conversion layer 107 by the pixel electrodes 104 and the opposing electrode 108, and when light is incident on the photoelectric conversion layer 107 while in the aforementioned state, the photoelectric conversion layer 107 generates an electrical charge (represented by white circles in FIG. 3) through conversion of the incident light. Here, the bias voltage applied to the photoelectric conversion layer 107 is equivalent to an electric potential difference between the opposing electrode 108 and the pixel electrodes 104.

An electrical charge generated in the photoelectric conversion layer 107 is transferred via a corresponding pixel electrode 104 and connector 105 to an accumulation diode 1151 in a corresponding readout circuit 115. The electrical charge is temporarily accumulated in the accumulation diode 1151, and at an appropriate timing is output externally as a signal through open-close operation of a transistor or the like in the readout circuit 115.

3. Configuration of Dummy Layer Portions 11

Configuration of the dummy layer portions 11 is explained with reference to FIG. 4.

Figure 4:
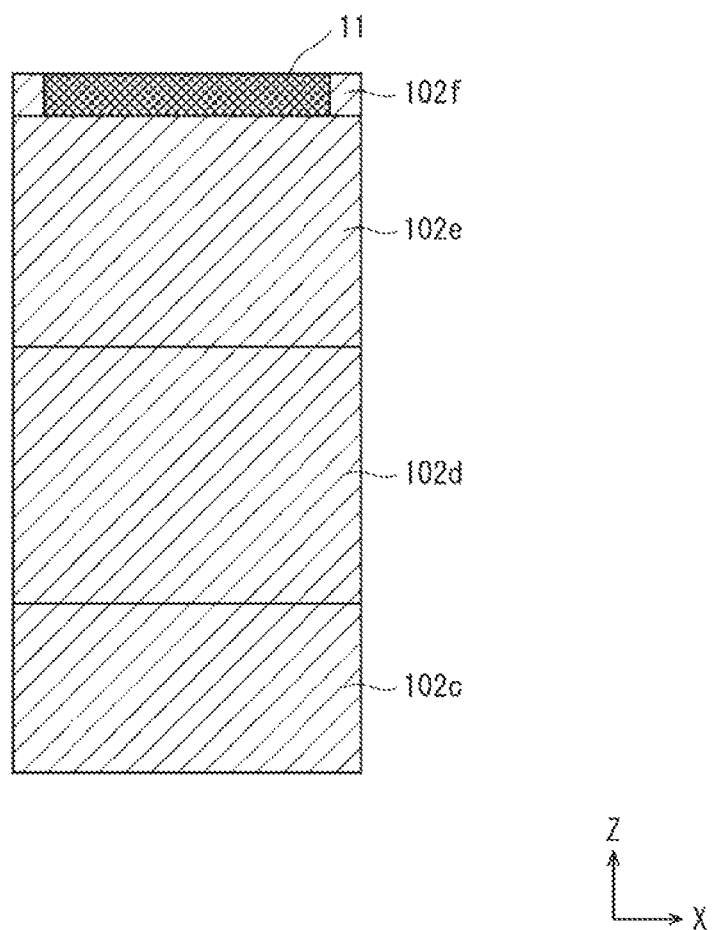
FIG. 4 is a cross-sectional schematic diagram illustrating configuration of a dummy layer portion 11.

As illustrated in FIG. 4, in the solid-state imaging apparatus 1 relating to the present embodiment, each of the dummy layer portions 11 is located on an upper surface, in terms of the Z-axis direction, of the configuration sub-layer 102e of the insulating layer 102. Also, the configuration sub-layer 102f of the insulating layer 102 is located in intervals between each two of the dummy layer portions 11 which are adjacent to one another. The above configuration is similar to configuration of the pixel electrodes 104 and the insulating layer 102 in the pixel region 10.

In FIG. 4, an upper surface of the configuration sub-layer 102f in terms of the Z-axis direction is illustrated as being level to upper surfaces of the dummy layer portions 11 in terms of the Z-axis direction, but in reality the upper surface of the configuration sub-layer 102f is located lower, in terms of the Z-axis direction, than the upper surfaces of the dummy layer portions 11.

4. Size and Arrangement of Dummy Layer Portions 11

Figure 5A:
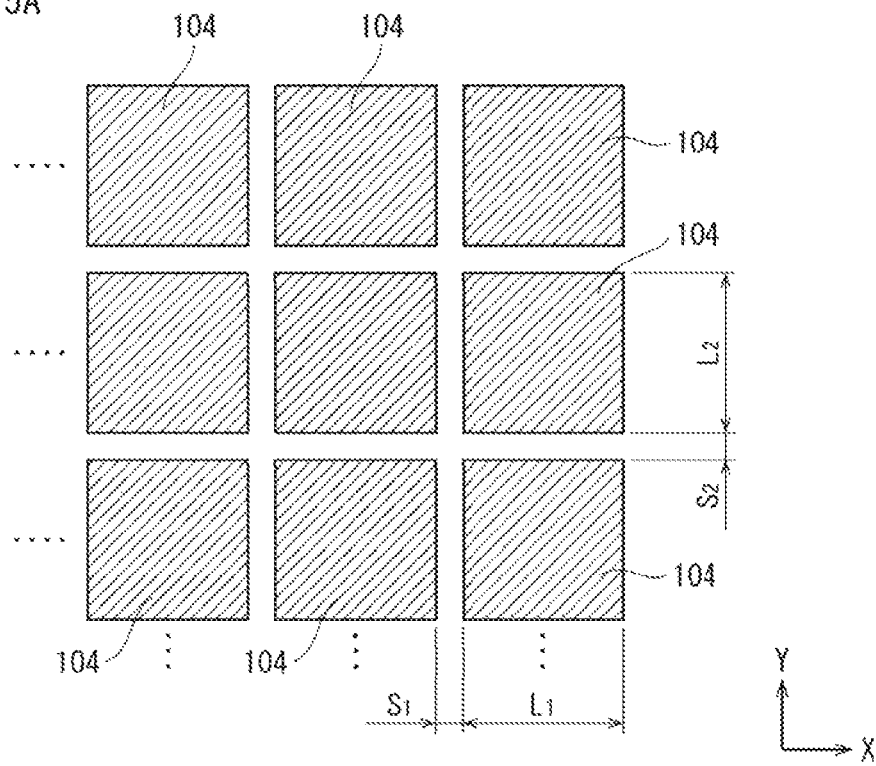
FIG. 5A is a plan-view schematic diagram illustrating size and arrangement of pixel electrodes 104.

Size and arrangement of the dummy layer portions 11 is explained with reference to FIGS. 5A and 5B. FIG. 5A is a plan-view schematic diagram illustrating size and arrangement of the pixel electrodes 104 in the pixel region 10, and FIG. 5B is a plan-view schematic diagram illustrating size and arrangement of the dummy layer portions 11 in the dummy region.

As illustrated in FIG. 5A the pixel electrodes 104 in the pixel region 10 are arranged in a matrix in accordance with arrangement of the pixels 100. Each of the pixel electrodes 104 has a rectangular shape in plan-view, and has a length $L_1$ in terms of the X-axis direction and a length $L_2$ in terms of the Y-axis direction. An interval between each two of the pixel electrodes 104 which are adjacent in terms of the X-axis direction is of distance $S_1$, and an interval between each two of the pixel electrodes 104 which are adjacent in terms of the Y-axis direction is of distance $S_2$.

In FIG. 5A each of the pixel electrodes 104 is illustrated as having a square shape in plan-view, but depending on shape and arrangement of the pixels 100 in the pixel region 10, the pixel electrodes 104 may have a different shape.

Figure 5B:
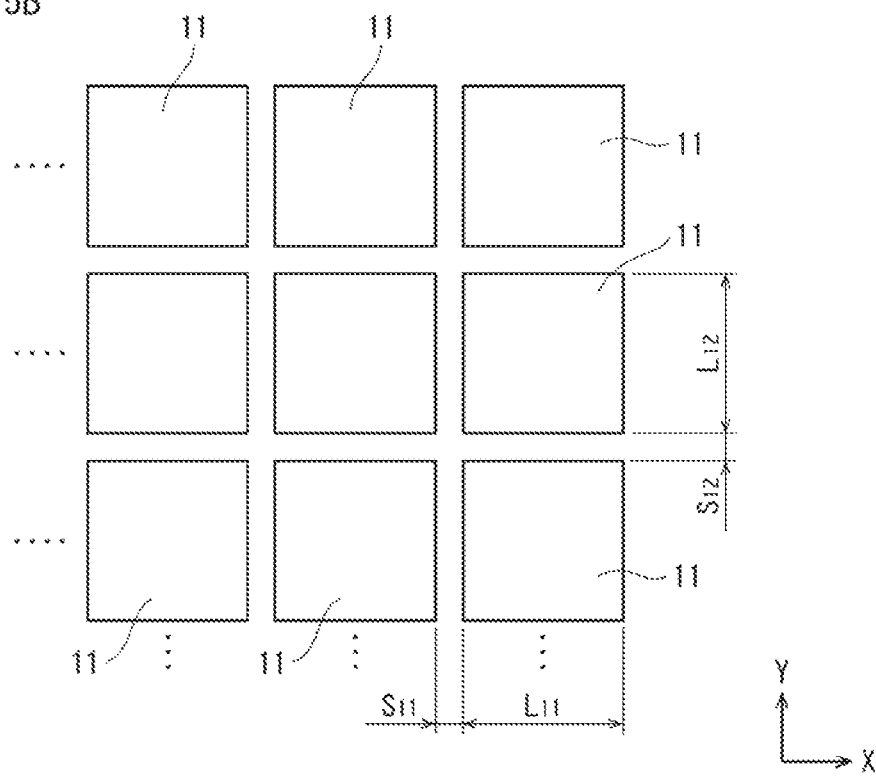
FIG. 5B is a plan-view schematic diagram illustrating size and arrangement of dummy layer portions 11.

As illustrated in FIG. 5B, the dummy layer portions 11 in the dummy region are also arranged in a matrix. Each of the dummy layer portions 11 has a rectangular shape in plan-view and has a length $L_{11}$ in terms of the X-axis direction, and a length $L_{12}$ in terms of the Y-axis direction. An interval between each two of the dummy layer portions 11 which are adjacent in terms of the X-axis direction is of distance $S_{11}$ and an interval between each two of the dummy layer portions 11 which are adjacent in terms of the Y-axis direction is of distance $S_{12}$.

For example, in the present embodiment the following relations are satisfied.

$$L_1 = L_{11} \quad \text{[MATH. 1]}$$

$$L_2 = L_{12} \quad \text{[MATH. 2]}$$

$$S_1 = S_{11} \quad \text{[MATH. 3]}$$

$$S_2 = S_{12} \quad \text{[MATH. 4]}$$

5. Formation Range of Dummy Layer Portions 11

Figure 6:
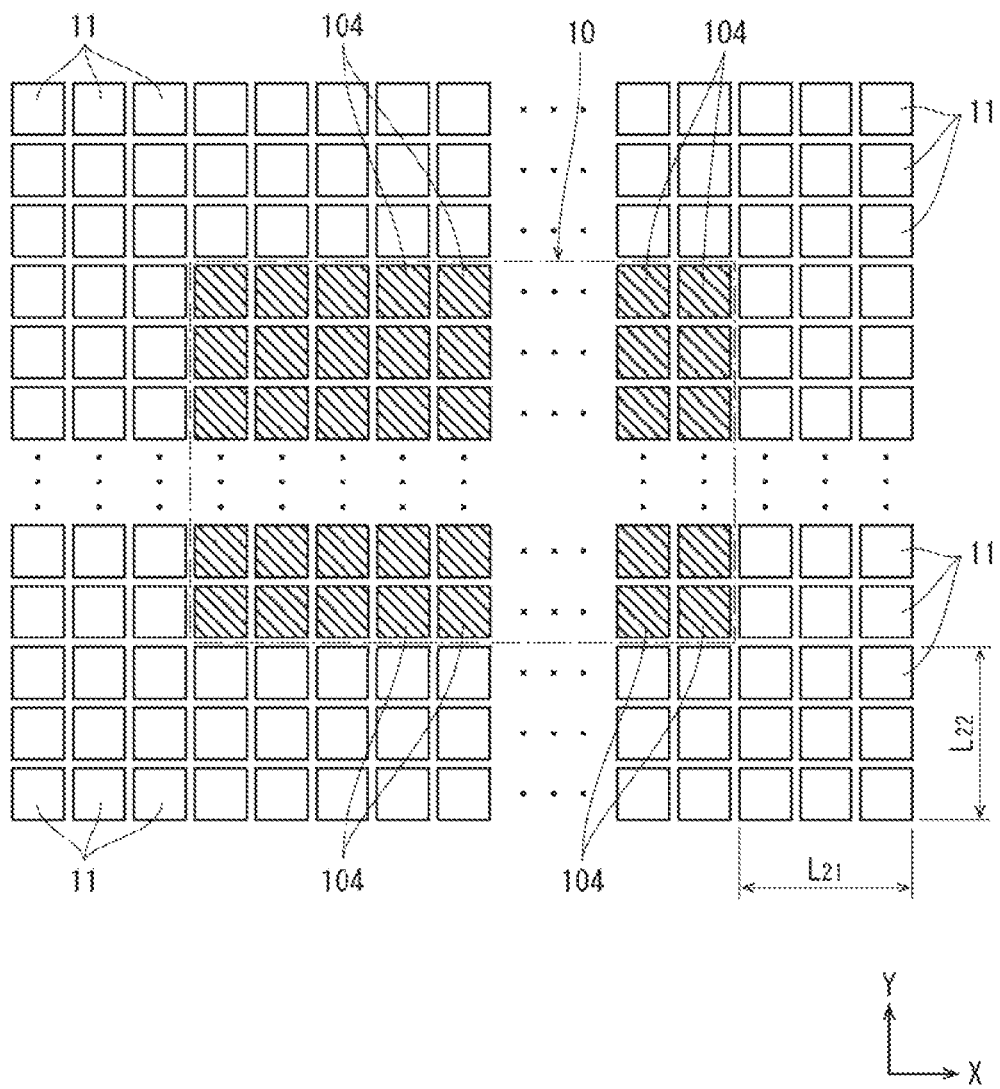
FIG. 6 is a plan-view schematic diagram illustrating arrangement of the dummy layer portions 11, relative to the pixel region 10.

The following explains, with reference to FIG. 6, formation range of the dummy layer portions 11, or in other words, range of the dummy region.

As illustrated in FIG. 6, the dummy layer portions 11 are arranged such as to surround an entire periphery of the pixel region 10.

In the present embodiment the dummy region extends from the periphery of the pixel region 10 for a range of length $L_{21}$ in the X-axis direction, and a range of length $L_{22}$ in the Y-axis direction. The lengths $L_{21}$ and $L_{22}$ satisfy the following relations.

$$L_{21} \geq 5 \times L_1 \quad \text{[MATH. 5]}$$

$$L_{22} \geq 5 \times L_2 \quad \text{[MATH. 6]}$$

As illustrated in FIG. 6, in the present embodiment the dummy layer portions 11 are arranged such as to triply surround the entire periphery of the pixel region 10. However, so long as the dummy layer portions 11 are arranged such that MATH. 5 and 6 are satisfied, high precision control is possible of film thickness and smooth surfaces of the pixel electrodes 104 throughout the entire pixel region 10, during planarization of the pixel electrodes 104 by CMP.

In the present embodiment the dummy layer portions 11 are arranged as illustrated in FIG. 6, but arrangement of the dummy layer portions 11 is not limited to the arrangement illustrated in FIG. 6. For example, range of the dummy region may alternatively be such that the dummy region extends from the periphery of the pixel region 10, and extends as far as the pad region (refer to FIG. 2). Arranging the dummy layer portions 11 throughout an unoccupied region such as described above, enables even higher precision control of film thickness and smooth surfaces of the pixel electrodes 104 throughout the entire pixel region 10, during planarization of the pixel electrodes 104 by CMP.

Also, as illustrated in FIGS. 5 and 6, in the present embodiment the pixel electrodes 104 and the dummy layer portions 11 are the same in terms of size and intervals therebetween. However, arrangement of the pixel electrodes 104 and the dummy layer portions 11 is not limited to the arrangement illustrated in FIGS. 5 and 6. For example, a percentage area which is occupied by the pixel electrodes 104 and the dummy layer portions 11 in a corresponding region can be stipulated as shown below.

$$(0.5 \times A_1) \leq A_2 \leq (1.5 \times A_1) \quad \text{[MATH. 7]}$$

In MATH. 7, $A_1$ represents a percentage of area of the pixel region 10 which is occupied by the pixel electrodes 104, and $A_2$ represents a percentage of area of the dummy region which is occupied by the dummy layer portions 11. $A_2$ is presumed to be a value greater than 0% and less than 100%.

More specifically, $A_1$ and $A_2$ can be expressed as shown below.

$$A_1 = (L_1 \times L_2) / ((L_1 + S_1) \times (L_2 + S_2)) \times 100 \quad \text{[MATH. 8]}$$

$$A_2 = (L_{11} \times L_{12}) / ((L_{11} + S_{11}) \times (L_{12} + S_{12})) \times 100 \quad \text{[MATH. 9]}$$

MATH. 7 shows that even if the percentage area occupied by the dummy layer portions 11 in the dummy region is as little as 0.5 times the percentage area occupied by the pixel electrodes 104 in the pixel region 10, or as much as 1.5 times the percentage area occupied by the pixel electrodes 104 in the pixel region 10, high precession control is still possible of film thickness and smooth surfaces of pixel electrodes 104 in a peripheral part of the pixel region 10, during planarization of the pixel electrodes 104 by CMP. In a specific example, when cell pitch in the pixel region 10 is 1.75 μm, $L_1 = L_2 = 1.43$ μm and S₁=S₂=0.30 μm, then the percentage area $A_1$ occupied by the pixel electrodes 104 in the pixel region 10 is 69%. In the above situation, the percentage area $A_2$ occupied by the dummy layer portions 11 in the dummy region should preferably be in a range of 35% to 95%. If the percentage area $A_2$ is not in the aforementioned range, it is difficult to achieve high precision control of film thickness and smooth surfaces of pixel electrodes 104 in the peripheral part of the pixel region 10, during planarization of the pixel electrodes 104 by CMP.

In the above situation in which the cell pitch is 1.75 μm, $L_1=L_2=1.45$ μm and $S_1=S_2=0.30$ μm, relations $L_{11}=L_{12}=1.45$ μm and $S_{11}S=~12=0.30$ μm can be derived for the present embodiment. Film thickness of each of the pixel electrodes 104 is in a range of 60 nm to 80 nm (for example, 80 nm) and film thickness of the insulating layer 102 is in a range of 700 nm to 800 nm.

6. Materials Used to Configure Pixel Electrodes 104 and Dummy Layer Portions 11

In the present embodiment, the pixel electrodes 104 are for example made from a conductive material including at least one of TiN, Ti, Al, Ta, TaN, Cu and W.

On the other hand, in a configuration in which the dummy layer portions 11 are made from a metal material, use of Cu, Al, Ti, Ta or the like is preferable. However, in the present embodiment the dummy layer portions 11 do not function as electrodes. Therefore, it is not essential that the dummy layer portions 11 are made from a conductive material.

7. Method for Manufacturing Solid-state Imaging Apparatus 1 The following explains, with reference to sections (a) to (d) of FIG. 7, a method for manufacturing the solid-state imaging apparatus 1 relating to the present embodiment. The following only provides explanation of steps relating to formation of the pixel electrodes 104 and the dummy layer portions 11, which are specific features of the solid-state imaging apparatus 1. Explanation of other steps is omitted.

As illustrated in section (a) of FIG. 7, the first the configuration sub-layer 102e is formed above wiring 116, which is an uppermost layer of multilayer wiring on the configuration sub-layer 102d of the insulating layer 102, by chemical vapor deposition (CVD). The configuration sub-layer 102e for example has a film thickness of 500 nm and is made from $SiO_2$. Next, a first resist pattern (not illustrated) including a first via pattern is formed above the configuration sub-layer 102e by lithography.

Next, dry etching is performed on the configuration sub-layer 102e using the first resist pattern as a mask, thus forming plugs in a top section of the configuration sub-layer 102e. The first resist pattern is subsequently removed by ashing. Next, a first barrier metal film formed by layering of TaN and Ta, and a first metal film formed from Cu are deposited on the configuration sub-layer 102e in respective order by CVD or sputtering, such as to fill first wiring formation trenches.

The first barrier metal film may alternatively be formed from Ti and TiN. The first metal film may alternatively be formed from W.

Next, CMP is used in order to remove excess deposits on the upper surface of the configuration sub-layer 102e formed during deposition of the first metal barrier film and the first metal film, thus forming first metal plugs which are each configured by a first metal barrier film 105a and the first metal film 105b. Through the above, via plugs can be formed which each connect one of the pixel electrodes 104 to wiring of a corresponding readout circuit (refer to section (a) of FIG. 7).

Next, TiN is deposited by CVD or physical vapor deposition (PVD) such as to form a metal film of film thickness 200 nm. A second resist pattern (not illustrated) including a pixel electrode pattern is subsequently formed above the metal film by lithography. Next, dry etching is performed on the metal film using the second resist pattern as a mask, thus forming a plurality of metal films 1041 and 1101 above the configuration sub-layer 102e. The metal films 1041 are to be used for the pixel electrodes 104, and the metal films 1101 are to be used for the dummy layer portions 11. The second resist pattern is subsequently removed by ashing (illustrated in section (b) of FIG. 7).

As described above, the metal films 1041 and 1101 are formed from a metal material which can be etched, such as Ti, Ta, TaN, Al or W.

With regards to the metal films 1101 which are to be used for the dummy layer portions 11, as illustrated in section (b) of FIG. 7, each of the metal films 1101 may be formed directly on top of the configuration sub-layer 102e, without provision of a corresponding via plug, in an electrically isolated state relative to other wiring.

Next, an insulating film 1021f is formed by CVD and PVD above the metal films 1041 for the pixel electrodes 104, and the metal films 1101 for the pixel electrodes 104, such as to cover the metal films 1041 and 1101 (refer to section (c) of FIG. 7). The insulating film 1021f has a film thickness of 300 nm and is made from $SiO_2$.

Next, CMP and etching are performed on the insulating film 1021f. Even after surfaces of the metal films 1041 and 1101 become exposed, planarization is continued by performing a further fixed amount of CMP and etching. Through the above, residues of the insulating film 1021f are prevented, even film thickness of the pixel electrodes 104 is ensured, and formation of steps at edges of the pixel electrodes 104 in terms of the X-axis direction is inhibited. Through the above, formation of the pixel electrodes 104 and the dummy layer portions 11 is completed, the pixel electrodes 104 are planarized, and the configuration sub-layer 102f is formed by portions of the insulating layer 1021f remaining in intervals between the pixel electrodes 104 (refer to section (d) of FIG. 7).

FIRST MODIFIED EXAMPLE

Configuration of a solid-state imaging apparatus relating to a first modified example is explained with reference to FIG. 8. FIG. 8 is a plan-view schematic diagram for the first modified example which corresponds to FIG. 6 for the first embodiment. The first modified example has the same configuration as the first embodiment, except for in terms of formation range of dummy layer portions 21. Therefore, explanation of elements which are the same is omitted.

As illustrated in FIG. 8, in the solid-state imaging apparatus relating to the present modified example the dummy layer portions 21 are located in all regions other than the pixel region 10, the pad region (not illustrated in FIG. 8), and a region in which the connecting electrode 103 is located. In other words, the present modified example enables higher precision control, compared to the solid-state imaging apparatus relating to the first embodiment, of film thickness and smooth surfaces of pixel electrodes 104 in the peripheral part of the pixel region 10 when planarizing the pixel electrodes 104. The above effect is due to the dummy layer portions 21 being located in all regions other than the aforementioned regions. Consequently, the solid-state imaging apparatus relating to the present modified example enables further inhibition of decreased sensitivity, increased color-mixing and fluctuation in spectral properties, compared to the solid-state imaging apparatus relating to the first embodiment.

Furthermore, in an alternative configuration the dummy layer portions 21 may also be located in a region that in plan-view is more peripheral, relative to the pixel region, than the connecting electrode 103.

SECOND MODIFIED EXAMPLE

Configuration of a solid-state imaging apparatus relating to a second modified example is explained with reference to FIG. 9. FIG. 9 is a plan-view schematic diagram for the second modified example which corresponds to FIG. 6 for the first embodiment. The second modified example has the same configuration as the first embodiment, except for in terms of configuration of dummy layer portions 31. Therefore, explanation of elements which are the same is omitted.

As illustrated in FIG. 9, in the solid-state imaging apparatus relating to the present modified example the dummy layer portions 31 are located in an upper part of the peripheral circuit region. The dummy layer portions 31 differ from the dummy layer portions 11 in terms of shape; each of the dummy layer portions 31 has a rectangular shape. More specifically, each of the dummy layer portions 31 has a length $L_{31}$ in terms of the X-axis direction and a length $L_{31}$ in terms of the Y-axis direction. An interval between each two of the dummy layer portions 31 which are adjacent in terms of the X-axis direction is of distance $S_{31}$ and an interval between each two of the dummy layer portions 31 which are adjacent in terms of the Y-axis direction is of distance $S_{32}$.

In one example of configuration, the lengths $L_{31}$ and $L_{32}$, and the distances $S_{31}$ and $S_{32}$ for the dummy layer portions 31 satisfy the following relations.

$$L_{32} \geq (3 \times L_{31}) \qquad \text{[MATH. 10]}$$

$$S_{31} = S_{32} \qquad \text{[MATH. 11]}$$

In the solid-state imaging apparatus relating to the present modified example, through the dummy layer portions 31 arranged in the upper part of the peripheral circuit region, which each have a rectangular shape satisfying MATH. 10, external light is reliably prevented from reaching peripheral circuits. Therefore, the dummy layer portions 31 can further function as a light-blocking layer. An advantageous effect of the above is that necessity of separately forming a light-blocking layer in the upper part of the peripheral circuit region is negated. In the solid-state imaging apparatus relating to the present modified example, the above effect is achieved in addition to effects described for the solid-state imaging apparatuses relating to the first embodiment and the first modified example.

The present modified example has a configuration in which dummy peripherally to the pixel region 10, the dummy layer portions 11 are located in regions other than the upper part of the peripheral circuit region. However, dummy layer portions arranged in the regions other than the peripheral circuit region are not limited to being the dummy layer portions 11 which differ from the dummy layer portions 31 in terms of shape. For example, alternatively dummy layer portions in the other regions may have the same shape as the dummy layer portions 31.

THIRD MODIFIED EXAMPLE

Figure 10A:
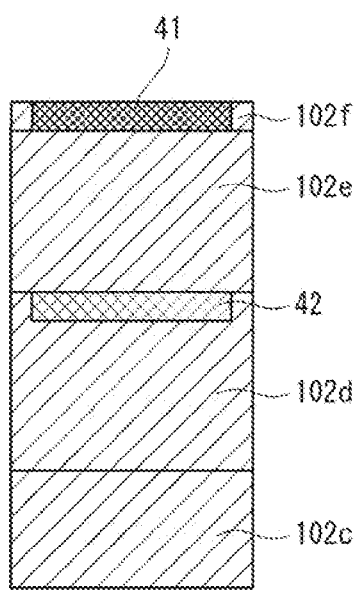
FIG. 10A is a cross-sectional schematic diagram illustrating configuration of a dummy layer portion 41 in a solid-state imaging apparatus relating to a third modified example.

Configuration of a solid-state imaging apparatus relating to a third modified example is explained with reference to FIG. 10A. FIG. 10A is a cross-sectional schematic diagram for the third modified example which corresponds to FIG. 4 for the first embodiment. The third modified example has the same configuration as the first embodiment, except for in terms of configuration of layers below dummy layer portions 41. Therefore, explanation of elements which are the same is omitted.

As illustrated in FIG. 10A, the solid-state imaging apparatus relating to the present modified example has the same configuration as the first embodiment in terms that each of the dummy layer portions 41 is located above the configuration sub-layer 102e of the insulating layer 102 (refer to FIG. 4). However, the present modified example differs in terms that a lower dummy layer portion 42, corresponding to the dummy layer portion 41, is located at an interface between the configuration sub-layer 102d and the configuration sub-layer 102e.

A configuration such as described above in which the lower dummy layer portion 42 is arranged at a lower layer level than the dummy layer portion 41, in the same way as wiring is arranged at a lower layer level than each of the pixel electrodes 104, ensures that during planarization of the pixel electrodes 104 by CMP, planarization conditions in the dummy region more closely match planarization conditions in the pixel region 10. Therefore, the solid-state imaging apparatus relating to the present modified example enables higher precision control of film thickness and smooth surfaces of the pixel electrodes 104 in the peripheral part of the pixel region 10, when planarizing the pixel electrodes 104.

FOURTH MODIFIED EXAMPLE

Figure 10B:
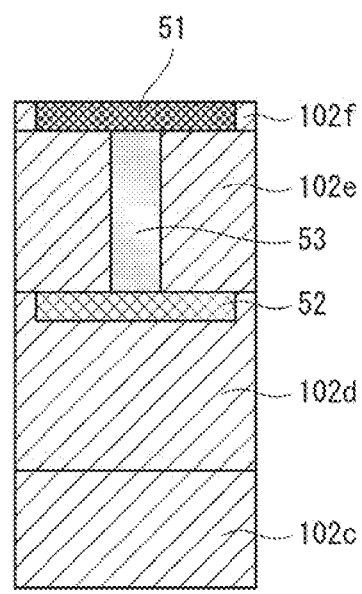
FIG. 10B is a cross-sectional schematic diagram illustrating configuration of a dummy layer portion 51 in a solid-state imaging apparatus relating to a fourth modified example.

Configuration of a solid-state imaging apparatus relating to a fourth modified example is explained with reference to FIG. 10B. FIG. 10B is a cross-sectional schematic diagram for the fourth modified example which corresponds to FIG. 4 for the first embodiment. The fourth modified example has the same configuration as the first embodiment, except for in terms of configuration of layers below dummy layer portions 51. Therefore, explanation of elements which are the same is omitted.

As illustrated in FIG. 10B, the solid-state imaging apparatus relating to the present modified example has the same configuration as the first embodiment in terms that each of the dummy layer portions 51 is located above the configuration sub-layer 102e of the insulating layer 102 (refer to FIG. 4), and has the same configuration as the third modified example (refer to FIG. 10A) in terms that a lower dummy layer portion 52, corresponding to the dummy layer 51, is located at an interface between the configuration sub-layer 102d and the configuration sub-layer 102e.

The present modified example differs from the third modified example in terms that the dummy layer portion 51 is connected to the lower dummy layer portion 52 by a dummy plug 53 passing through the configuration sub-layer 102e in a thickness direction thereof.

A configuration such as described above in which the lower dummy layer portion 52 is arranged at a lower layer level than the dummy layer portion 51, and in which the dummy layer portion 51 is connected to the lower dummy layer portion 52 by the dummy plug 53 located therebetween, is similar to the configuration in which wiring is arranged at a lower layer level than each of the pixel electrodes 104, and in which the pixel electrode 104 is connected to the wiring by a via plug located therebetween. Consequently, the above configuration ensures that during planarization of the pixel electrodes 104 by CMP, planarization conditions in the dummy region more closely match planarization conditions in the pixel region 10. Therefore, adopting the configuration of the solid-state imaging apparatus in the present modified example enables higher precision control of film thickness and smooth surfaces of the pixel electrodes 104 in the peripheral part of the pixel region 10 when planarizing the pixel electrodes 104.

FIFTH MODIFIED EXAMPLE

Figure 11:
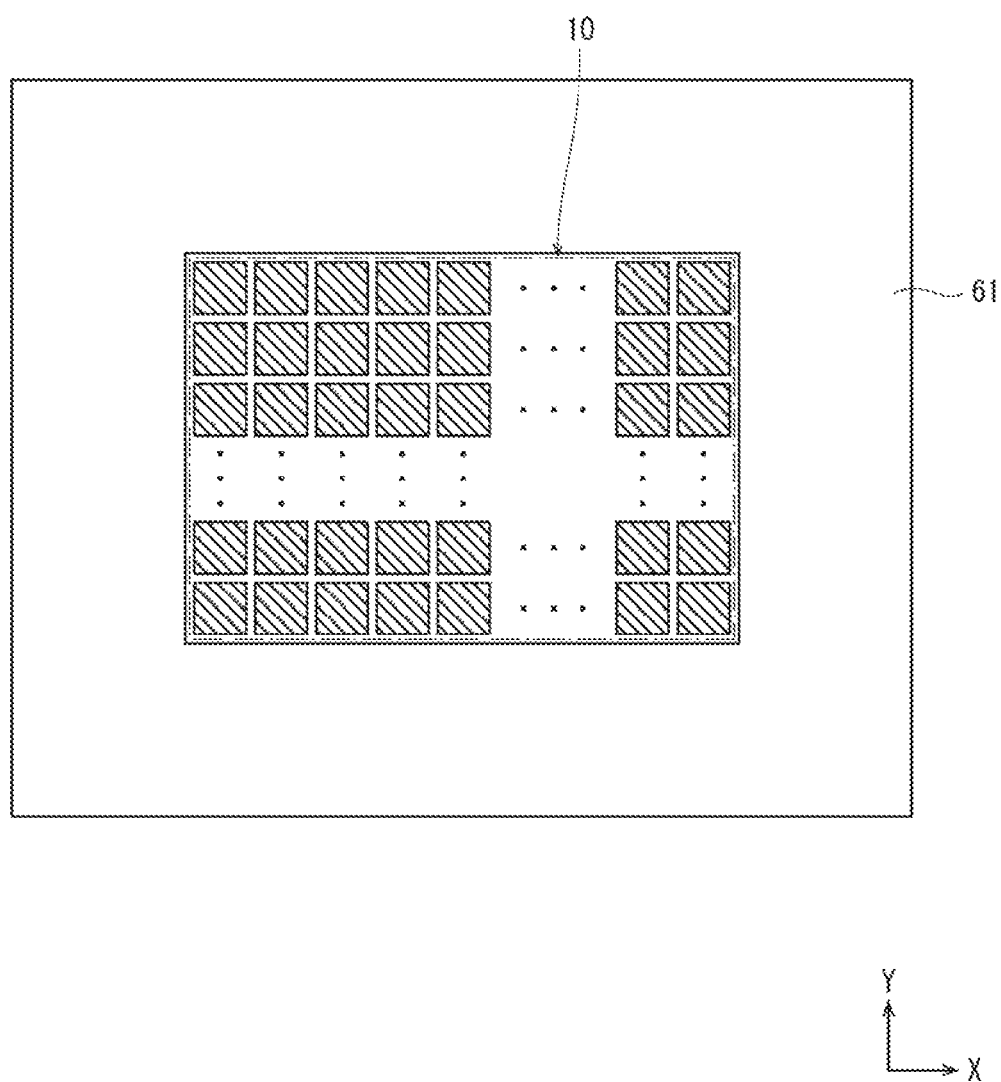
FIG. 11 is a plan-view schematic diagram illustrating configuration of a dummy layer 61 in a solid-state imaging apparatus relating to a fifth modified example.

Configuration of a solid-state imaging apparatus relating to a fifth modified example is explained with reference to FIG. 11. FIG. 11 is a plan-view schematic diagram for the fifth modified example which corresponds to FIG. 6 for the first embodiment. The fifth modified example has the same configuration as the first embodiment, except for in terms of shape of a dummy layer 61 in plan-view. Therefore, explanation of elements which are the same is omitted.

As illustrated in FIG. 11, the solid-state imaging apparatus relating to the present modified example differs from the first embodiment in terms that the dummy layer 61 is a single continuous layer having a ring-like shape that surrounds the periphery of the pixel region 10. In other words, in the present modified example the periphery of the pixel region 10 is surrounded by a single continuous dummy layer, the dummy layer 61, instead of being surrounded by a dummy layer composed of a plurality of separate dummy layer portions. Therefore, the present modified example is superior to the first embodiment and the modified examples described above, in terms of effectiveness of blocking external light in regions other than the pixel region 10.

An effect of high precision control of film thickness and smooth surfaces of the pixel electrodes 104 in the peripheral part of the pixel region 10, compared to the conventional solid-state imaging apparatus, can be achieved in the same way as described above, even in a configuration such as described in the present modified example in which the periphery of the pixel region 10 is surrounded by the dummy layer 61, which is a single continuous layer.

SIXTH MODIFIED EXAMPLE

Figure 12A:
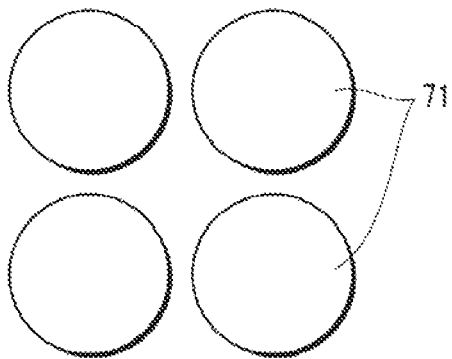
FIG. 12A is a plan-view schematic diagram illustrating configuration of dummy layer portions 71 in a solid-state imaging apparatus relating to a sixth modified example.

Configuration of a solid-state imaging apparatus relating to a sixth modified example is explained with reference to FIG. 12A. FIG. 12A is a plan-view schematic diagram illustrating shape of dummy layer portions 71. The sixth modified example has the same configuration as the first embodiment, except for in terms of shape of the dummy layer portions 71 in plan-view. Therefore, explanation of elements which are the same is omitted.

As illustrated in FIG. 12A, in the solid-state imaging apparatus of the present modified example, each of the dummy layer portions 71 has a circular shape in plan-view. The dummy layer portions 71, each having a circular shape in plan-view, are arranged in a matrix. The dummy layer portions 71 can for example be arranged as illustrated in any of FIGS. 6, 8 and 9.

The effect of high precision control of film thickness and smooth surfaces of pixel electrodes 104 in the peripheral part of the pixel region 10, compared to the conventional solid-state imaging apparatus, can be achieved even in a configuration in which the dummy layer portions 71, each having a circular shape in plan-view, are used.

Furthermore, in terms of arrangement of the dummy layer portions 71, it is not essential that the dummy layer portions 71 are arranged in a matrix. For example, in an alternative configuration, each two of the dummy layer portions 71 which are adjacent to one another may be shifted relative to one another by a distance equivalent to a radius thereof.

SEVENTH MODIFIED EXAMPLE

Figure 12B:
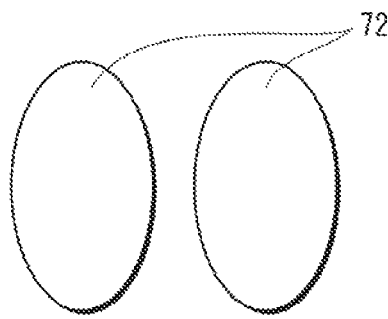
FIG. 12B is a plan-view schematic diagram illustrating configuration of dummy layer portions 72 in a solid-state imaging apparatus relating to a seventh modified example.

Configuration of a solid-state imaging apparatus relating to a seventh modified example is explained with reference to FIG. 12B. FIG. 12B is a plan-view schematic diagram illustrating shape of dummy layer portions 72. The seventh modified example has the same configuration as the first embodiment, except for in terms of shape of the dummy layer portions 72 in plan-view. Therefore, explanation of elements which are the same is omitted.

As illustrated in FIG. 12B, in the solid-state imaging apparatus of the present modified example, each of the dummy layer portions 72 has an elliptical shape in plan-view. The dummy layer portions 72, each having an elliptical shape in plan-view, are arranged in a matrix. The dummy layer portions 72 can for example be arranged as illustrated in any of FIGS. 6, 8 and 9.

The effect of high precision control of film thickness and smooth surfaces of the pixel electrodes 104 in the peripheral part of the pixel region 10, compared to the conventional solid-state imaging apparatus, can be achieved even in a configuration in which the dummy layer portions 72, each having an elliptical shape in plan-view, are used.

Furthermore, in terms of arrangement of the dummy layer portions 72, it is not essential that the dummy layer portions 72 are arranged in a matrix. For example, in an alternative configuration, each two of the dummy layer portions 72 which are adjacent to one another may be shifted relative to one another by a half pitch in a major axis direction thereof.

EIGHTH MODIFIED EXAMPLE

Figure 12C:
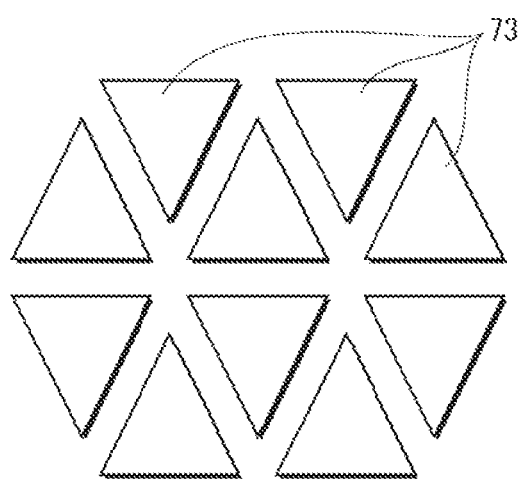
FIG. 12C is a plan-view schematic diagram illustrating configuration of dummy layer portions 73 in a solid-state imaging apparatus relating to an eighth modified example.

Configuration of a solid-state imaging apparatus relating to an eighth modified example is explained with reference to FIG. 12C. FIG. 12C is a plan-view schematic diagram illustrating shape of dummy layer portions 73. The eighth modified example has the same configuration as the first embodiment, except for in terms of shape of the dummy layer portions 73 in plan-view. Therefore, explanation of elements which are the same is omitted.

As illustrated in FIG. 12C, in the solid-state imaging apparatus relating to the present modified example, each of the dummy layer portions 73 has a triangular shape in plan-view. The dummy layer portions 73, each having a triangular shape in plan-view, are arranged in rows, wherein orientations of the dummy layer portions 73 in adjacent rows are reversed relative to one another.

The effect of high precision control of film thickness and smooth surfaces of the pixel electrodes 104 in the peripheral part of the pixel region 10, compared to the conventional solid-state imaging apparatus, can be achieved even in a configuration in which the dummy layer portions 73, each having a triangular shape in plan-view, are used.

Furthermore, in terms of arrangement of the dummy layer portions 73, it is not essential that orientations of the dummy layer portions 73 are reversed in adjacent rows. For example, in an alternative configuration, the dummy layer portions 73 may be arranged in rows, and orientations of the dummy layer portions 73 may be the same in all of the rows.

NINTH MODIFIED EXAMPLE

Figure 13A:
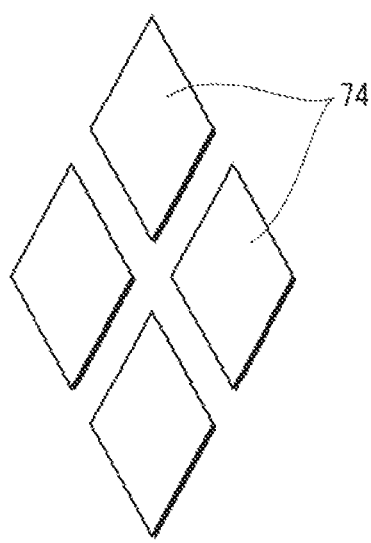
FIG. 13A is a plan-view schematic diagram illustrating configuration of dummy layer portions 74 in a solid-state imaging apparatus relating to a ninth modified example.

Configuration of a solid-state imaging apparatus relating to a ninth modified example is explained with reference to FIG. 13A. FIG. 13A is a plan-view schematic diagram illustrating shape of dummy layer portions 74. The ninth modified example has the same configuration as the first embodiment, except for in terms of shape of the dummy layer portions 74 in plan-view. Therefore, explanation of elements which are the same is omitted.

As illustrated in FIG. 13A, in the solid-state imaging apparatus relating to the present modified example, each of the dummy layer portions 74 has a rhombic shape in plan-view. The dummy layer portions 74, each having a rhombic shape in plan-view, are arranged such that adjacent edges of the dummy layer portions 74 are facing one another.

The effect of high precision control of film thickness and smooth surfaces of the pixel electrodes 104 in the peripheral part of the pixel region 10, compared to the conventional solid-state imaging apparatus, can be achieved even in a configuration in which the dummy layer portions 74, each having a rhombic shape in plan-view, are used.

Furthermore, in terms of arrangement of the dummy layer portions 74, it is not essential that the dummy layer portions 74 are orientated as illustrated in FIG. 13A. For example, alternatively orientations of the dummy layer portions 74 may be rotated 90° compared to in FIG. 13A.

TENTH MODIFIED EXAMPLE

Figure 13B:
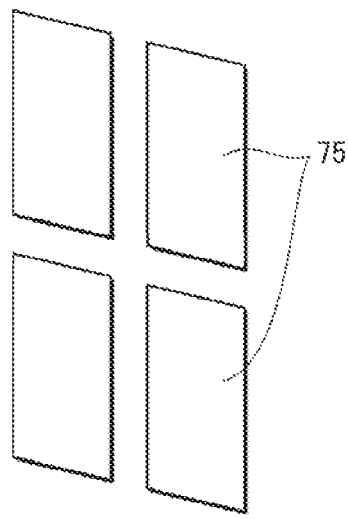
FIG. 13B is a plan-view schematic diagram illustrating configuration of dummy layer portions 75 in a solid-state imaging apparatus relating to a tenth modified example.

Configuration of a solid-state imaging apparatus relating to a tenth modified example is explained with reference to FIG. 13B. FIG. 13B is a plan-view schematic diagram illustrating shape of dummy layer portions 75. The tenth modified example has the same configuration as the first embodiment, except for in terms of shape of the dummy layer portions 75 in plan-view. Therefore, explanation of elements which are the same is omitted.

As illustrated in FIG. 13B, in the solid-state imaging apparatus relating to the present modified example, each of the dummy layer portions 75 has a parallelogram shape in plan-view. The dummy layer portions 75, each having a parallelogram shape in plan-view, are arranged such that adjacent edges of the dummy layer portions 75 are facing one another.

The effect of high precision control of film thickness and smooth surfaces of the pixel electrodes 104 in the peripheral part of the pixel region 10, compared to the conventional solid-state imaging apparatus, can be achieved even in a configuration in which the dummy layer portions 75, each having a parallelogram shape in plan-view, are used.

Furthermore, in terms of arrangement of the dummy layer portions 75, it is not essential that the dummy layer portions 74 are orientated as illustrated in FIG. 13B. For example, alternatively orientations of the dummy layer portions 75 may be rotated 90° compared to in FIG. 13B.

ELEVENTH MODIFIED EXAMPLE

Figure 13C:
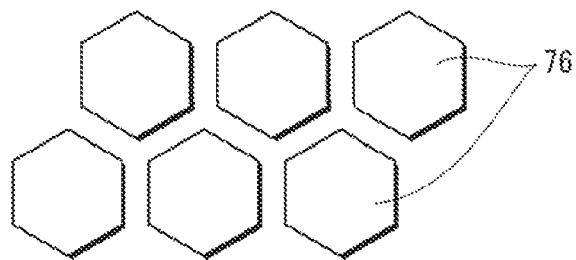
FIG. 13C is a plan-view schematic diagram illustrating configuration of dummy layer portions 76 in a solid-state imaging apparatus relating to an eleventh modified example.

Configuration of a solid-state imaging apparatus relating to an eleventh modified example is explained with reference to FIG. 13C. FIG. 13C is a plan-view schematic diagram illustrating shape of dummy layer portions 76. The eleventh modified example has the same configuration as the first embodiment, except for in terms of shape of the dummy layer portions 76 in plan-view. Therefore, explanation of elements which are the same is omitted.

As illustrated in FIG. 13C, in the solid-state imaging apparatus relating to the present modified example, each of the dummy layer portions 76 has a hexagonal shape in plan-view. The dummy layer portions 76, each having a hexagonal shape in plan-view, are arranged such that adjacent edges of the dummy layer portions 76 are facing one another.

The effect of high precision control of film thickness and smooth surfaces of the pixel electrodes 104 in the peripheral part of the pixel region 10, compared to the conventional solid-state imaging apparatus, can be achieved even in a configuration in which the dummy layer portions 76, each having a hexagonal shape in plan-view, are used.

TWELFTH MODIFIED EXAMPLE

A method for manufacturing a solid-state imaging apparatus relating to a twelfth modified example is explained with reference to sections (a) to (d) of FIG. 14. Steps in production of the solid-state imaging apparatus relating to the twelfth modified example are the same as in the first embodiment, except for in terms of steps for forming pixel electrodes 804 and dummy layer portions 81. Therefore, explanation of steps which are the same is omitted.

First, the configuration sub-layer 102e is formed above wiring 116, which is an uppermost layer of multilayer wiring on the configuration sub-layer 102d of the insulating layer 102. The configuration sub-layer 102e has a film thickness of 500 nm and is made from $SiO_2$. Next, a first resist pattern including a first via pattern is formed above the configuration sub-layer 102e by lithography.

Next, dry etching is performed on the configuration sub-layer 102e using the first resist pattern as a mask, thus forming plugs above the configuration sub-layer 102d. The first resist pattern is subsequently removed by ashing. Next, a first barrier metal film formed by layering of TaN and Ta, and a first metal film formed from Cu are deposited on the configuration sub-layer 102e in respective order by CVD or sputtering, such as to fill first wiring formation trenches.

The first barrier metal film may alternatively be formed from Ti and TiN. The first metal film may alternatively be formed from W.

Next, CMP is used in order to remove excess deposits on the upper surface of the configuration layer 102e from deposition of the first metal film and the first barrier metal film, thus forming first metal plugs each configured by a first metal barrier film 105a and a first metal film 105b (refer to section (a) of FIG. 14). Through the above, via plugs can be formed which each connect one of the pixel electrodes to wiring of a corresponding readout circuit.

Next, a configuration sub-layer 1022f is formed by CVD and PVD above the configuration sub-layer 102e and above the first metal plugs. The configuration sub-layer 1022f has a film thickness of 200 nm and is made from $SiO_2$. A second resist pattern including a pixel electrode pattern is subsequently formed above the configuration sub-layer 1022f by lithography.

Next, dry etching is performed on the configuration sub-layer 1022f using the second resist pattern as a mask, thus forming a plurality of formation trenches 102g for the pixel electrodes 104 in an upper part of the configuration sub-layer 1022f.

Next, the second resist pattern is removed by ashing (refer to section (b) of FIG. 14). Subsequently, a second barrier metal film 810b formed by layering of TaN and Ta, and a second metal film 810a formed from Cu are deposited on the configuration sub-layer 1022f in respective order by CVD or sputtering, such as to fill the formation trenches 102g (refer to section (c) of FIG. 14).

Next, CMP is used in order to remove excess deposits on the upper surface of the configuration sub-layer 1022f from deposition of the second metal barrier film 810b and the second metal film 810a.

Even after a surface of the configuration sub-layer 1022f becomes exposed during polishing by CMP, a further fixed amount of polishing is performed. Through the above, the pixel electrodes 804, each configured by a second barrier metal film 804b and the second metal film 804a, and the dummy layer portions 81, each configured by a second barrier metal film 81b and a second metal film 81a, can be formed (refer to section (d) of FIG. 14).

Through the above, residues of the second metal film 810a and the second barrier metal film 810b can be prevented, even film thickness of the pixel electrodes 804 can be ensured, and occurrence of steps at edges of the pixel electrodes 804 can be inhibited throughout the pixel region 10.

The second barrier metal film 810b may alternatively be formed from Ti and TiN. The second metal film 810a may alternatively be formed from W.

In the above explanation the via plugs and the pixel electrodes 804 are formed separately through a single Damascene process. Alternatively, the via plugs and the pixel electrodes 804 may be formed simultaneously through a dual Damascene process.

Furthermore, alternatively a first metal plug (first barrier metal film 105a and first metal film 105b) may be formed below each of the dummy layer portions 81 in the same way as for each of the pixel electrodes 804.

[Second Embodiment]

Figure 16:
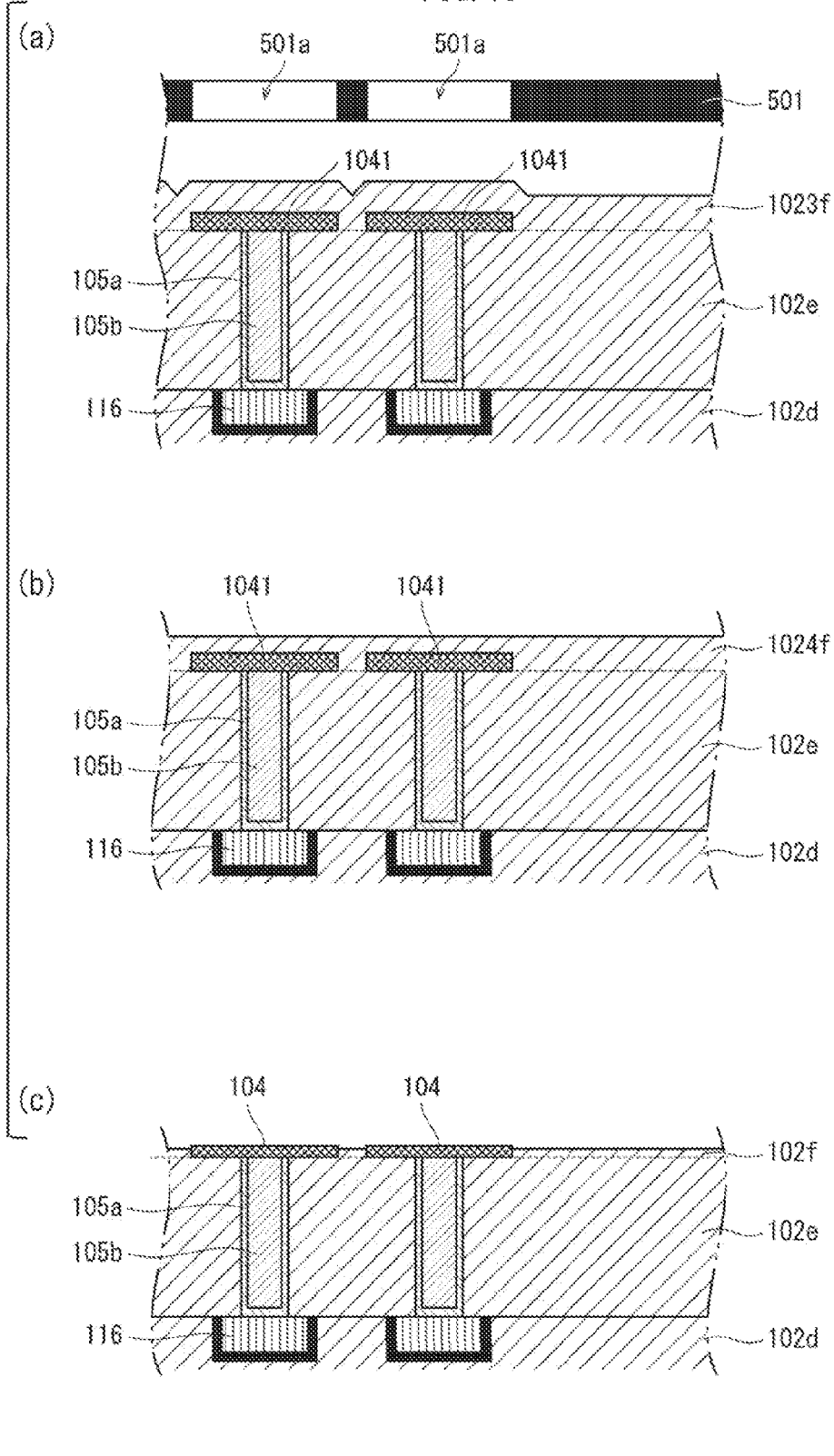
FIG. 16 illustrates, through ordered schematic process diagrams in sections (a) to (c), part of the process of manufacturing the solid-state imaging apparatus relating to a second embodiment.

The following explains, with reference to sections (a) to (c) of FIG. 15 and sections (a) to (c) of FIG. 16, a method for manufacturing a solid-state imaging apparatus relating to a second embodiment.

First, the configuration sub-layer 102e is formed by CVD or the like above wiring 116, which is an uppermost layer of multilayer wiring on the configuration sub-layer 102d of the insulating layer 102. The configuration sub-layer 102e has a film thickness of 500 nm and is made from $SiO_2$. Next, a first resist pattern including a first via pattern is formed above the configuration sub-layer 102e by lithography.

Next, dry etching is performed on the configuration sub-layer 102e using the first resist pattern as a mask, thus forming contact holes that pass through the configuration sub-layer 102e in a thickness direction thereof. The first resist pattern is subsequently removed by ashing. Next, a first barrier metal film formed from layering of TaN and Ta, and a first metal film formed from Cu are deposited in respective order on the configuration sub-layer 102e by CVD or sputtering, such as to fill each of the contact holes.

The first barrier metal film may alternatively be formed from Ti and TiN. The first metal film may alternatively be formed from W.

Next, CMP is used in order to remove excess deposits on an upper surface $102e_1$ of the configuration sub-layer 102e formed during deposition of the first metal film and the first barrier metal film, thus forming first metal plugs which are each configured by a first barrier metal film 105a and a first metal film 105b. Through the above, first metal plugs can be formed which each connect one of the pixel electrodes 104 to wiring of a corresponding readout circuit (refer to section (a) of FIG. 15).

Next, TiN is deposited by CVD or PVD such as to form a metal film of film thickness 200 nm. A second resist pattern including a pattern for the pixel electrodes 104 is subsequently formed above the first metal film by lithography.

Next, dry etching is performed on the first metal film using the second resist pattern as a mask, thus forming a plurality of metal films 1041, which are each to be used for one of the pixel electrodes 104, on the configuration layer 102e. The second resist pattern is subsequently removed by ashing (refer to section (b) of FIG. 15).

Here, the first metal film can be formed from a metal which can be etched, such as Ti, Ta, TaN or Al.

Next, an insulating film 1023f is formed above the metal films 1041 by CVD and PVD (refer to section (c) of FIG. 15). The insulating film 1041 has a film thickness of 300 nm and is made from $SiO_2$.

Protrusions in the insulating film 1023f, which occur in parts of the insulating film 1023f located above the metal films 1041, are removed such that the parts in which the protrusions occur are level with other parts of the insulating film 1023f. More specifically, a resist mask 501 is positioned such that apertures 501a of the resist mask 501 correspond to the parts of the insulating film 1023f in which the protrusions occur (refer to section (a) of FIG. 16). Next, dry etching is performed on the insulating film 1023f while the resist mask 501 is in position, thus forming an insulating film 1024f through partial removal of the insulating film 1023f. Through the above, parts of the insulating film 1024f located above the metal films 1041 for the pixel electrodes 104 are level with other parts of the insulating film 1024f (refer to section (b) of FIG. 16).

Next, CMP and etching are performed on the insulating film 1024f. Even after upper surfaces of the metal films 1041 for the pixel electrodes 104 become exposed, a further fixed amount of polishing and etching is performed. Through the above, residues of the insulating layer 1024f are prevented, even film thickness of the pixel electrodes 104 is ensured, and formation of steps at edges of the pixel electrodes 104 is restricted throughout the entire pixel region 10 (refer to section (c) of FIG. 16).

THIRTEENTH MODIFIED EXAMPLE

Figure 18:
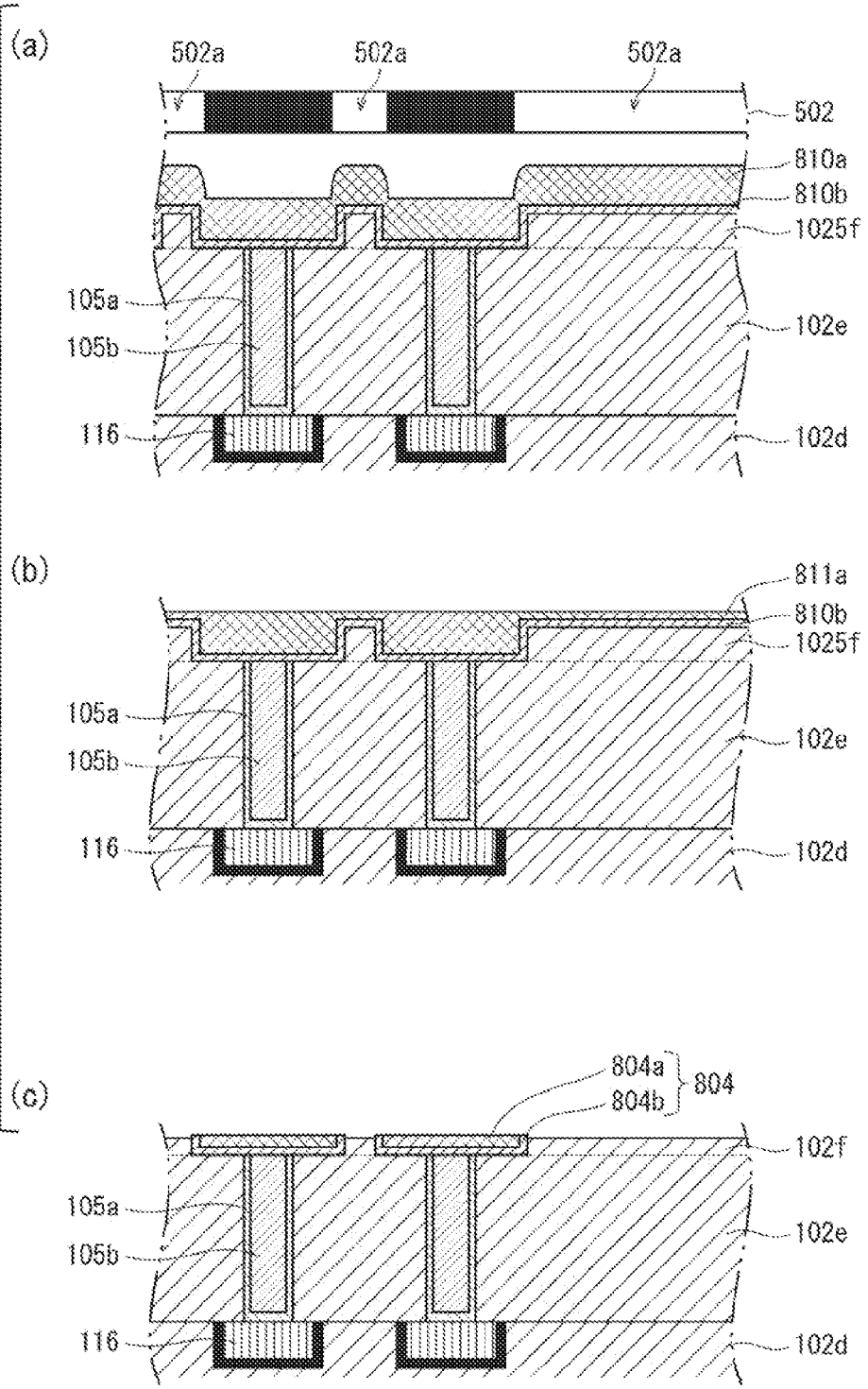
FIG. 18 illustrates, through ordered schematic process diagrams in sections (a) to (c), another part of the process of manufacturing the solid-state imaging apparatus relating to a thirteenth modified example.

The following explains, with reference to sections (a) to (c) of FIG. 17 and sections (a) to (c) of FIG. 18, a method for manufacturing a solid-state imaging apparatus relating to a thirteenth modified example.

For example, first the configuration sub-layer 102e is formed by CVD above wiring 116, which is an uppermost layer of multilayer wiring on the configuration sub-layer 102d of the insulating layer 102. The configuration sub-layer 102e has a film thickness of 500 nm and is made from $SiO_2$. Next, a first resist pattern including a first via pattern is formed above the configuration sub-layer 102e by lithography.

Next, dry etching is performed on the configuration sub-layer 102e using the first resist pattern as a mask, thus forming a plurality of contact holes that each pass through the configuration sub-layer 102e in a thickness direction thereof. The first resist pattern is subsequently removed by ashing. Next, a first barrier metal film formed from layering of TaN and Ta, and a first metal film formed from Cu are deposited over the configuration sub-layer 102e in respective order by CVD or sputtering, such as to fill each of the contact holes.

The first barrier metal film may alternatively be formed from Ti and TiN. The first metal film may alternatively be formed from W.

Next, CMP is used in order to polish, and thus remove, excess deposits on an upper surface $102e_1$ of the configuration sub-layer 102e formed during deposition of the first metal film and the first barrier metal film, thus forming first metal plugs which are each configured by a first barrier metal film 105a and a first metal film 105b. Through the above, first metal plugs can be formed which each connect one of the pixel electrodes 104 to wiring of a corresponding readout circuit (refer to section (a) of FIG. 17).

Next, an insulating film, having film thickness 200 nm and made from $SiO_2$, is formed by CVD and PVD above the configuration layer 102e (above the upper surface $102e_1$) and above each of the first metal plugs (first barrier metal film 105a and first metal film 105b). A second resist pattern including a first pixel electrode pattern is subsequently formed above the insulating film by lithography. Next, dry etching is performed on the insulating film using the second resist pattern as mask, thus etching certain parts of the insulating film. Through the above, a configuration sub-layer 1025f is formed which includes, in an upper portion thereof, a plurality of formation trenches 102h which are to be used for the pixel electrodes 104.

The second resist pattern is subsequently removed by ashing (refer to section (b) of FIG. 17). Next, a second barrier metal film 810b formed by layering of TaN and Ta, and a second metal film 810a formed from Cu are deposited over the configuration sub-layer 1025f in respective order by CVD or sputtering, such as to fill the formation trenches 102h (refer to section (c) of FIG. 17).

Next, parts of the second barrier metal film 810b and the second metal film 810a in which protrusions occur are partially removed such that the aforementioned parts are level with other parts of the second barrier metal film 810b and the second metal film 810a (i.e., parts where the pixel electrodes 804 are to be formed). More specifically, a resist mask 502 is arranged as illustrated in section (a) of FIG. 18 such that apertures 502a of the resist mask 502 correspond to the parts of the second barrier metal film 810b and the second metal film 810a in which the protrusions occur. Next, dry etching is performed with the resist mask 502 in place, thus forming a second metal film 811a through partial etching of the second metal film 810a. Through the above, an upper surface of the second metal film 811a in parts which do not correspond to the formation trenches 102h for the pixel electrodes 804 becomes level with the upper surface in all other parts of the second metal film 811a (refer to section (b) of FIG. 18).

Next, CMP is used to remove excess deposits on an upper surface of the configuration sub-layer 1025f formed during deposition of the second metal film 811a and the second barrier metal film 810b.

Even after the upper surface of the configuration sub-layer 1025f becomes exposed, a further fixed amount of polishing by CMP is performed. Through the above, the pixel electrodes 804, which are each configured by a second metal film 804a and a second barrier metal film 804b, can be formed (refer to section (c) of FIG. 18).

Consequently, residues of the second metal film 804a and the second barrier metal film 804b are prevented, even film thickness of the pixel electrodes 804 is ensured, and formation of steps at edges of the pixel electrodes 804 is restricted throughout the entire pixel region 10.

The second barrier metal film 804b may alternatively be formed from Ti and TiN. The second metal film 804a may alternatively be formed from W.

In the above explanation the first metal plugs and the pixel electrodes 804 are formed separately through a single Damascene process. Alternatively, the first metal plugs and the pixel electrodes 804 may be formed simultaneously through a dual Damascene process.

[Third Embodiment]

The following explains, with reference to FIG. 19, configuration of a solid-state imaging apparatus relating to a third embodiment of the present disclosure. FIG. 19 is a cross-sectional schematic diagram illustrating one part of configuration of the solid-state imaging apparatus relating to the third embodiment.

The first and second embodiments, and also the first to thirteenth modified examples, are explained as examples in which the solid-state imaging apparatus has a MOS type configuration. In contrast, the solid-state imaging apparatus relating to the present embodiment may have CCD type configuration.

As illustrated in FIG. 19, a substrate 901 includes a well region 901a, which configures an upper layer portion of the substrate 901. A gate insulating film 903 and an insulating layer 902 are layered in respective order above the substrate 901. Pixel electrodes 904, a photoelectric conversion layer 907, an opposing electrode 908, a buffering layer 909 and a sealing layer 910 are layered in respective order above the insulating layer 902.

As illustrated in FIG. 19, in the same way as in the first embodiment, the plurality of pixel electrodes 904 are arranged with intervals therebetween, for example in a matrix, in a pixel region 90. The insulating layer 902 includes a configuration sub-layer 902b which is located in the intervals between each two of the pixel electrodes 904 which are adjacent to one another.

A plurality of accumulation diodes 911 are located in the substrate 901, in a surface portion thereof in terms of a Z-axis direction. The accumulation diodes 911 are in one-to-one correspondence with a plurality of pixels. A plurality of vertical transfer channels 912 are also located in the surface portion of the substrate 901 at positions adjacent to the accumulation diodes 911. A plurality of vertical transfer electrodes 913 are located above the gate insulating film 903 in locations corresponding to the vertical transfer channels 912. Each of the vertical transfer electrodes 913 is covered by a light-blocking film 914 which blocks external light from being incident on the vertical transfer electrode 913.

Each of the pixel electrodes 904 is connected to a corresponding one of the accumulation diodes 911 via a connector 905 which passes through a configuration sub-layer 902a of the insulating layer 902.

In the present embodiment, a dummy layer composed of a plurality of dummy layer portions 91 is located above the configuration sub-layer 902a of the insulating layer 902 in a region that is peripheral to the pixel region 90. Each of the dummy layer portions 91 is equal to each of the pixel electrodes 904 in terms of size and film thickness. The dummy layer portions 91 are electrically isolated from other circuits and the like. In the solid-state imaging apparatus relating to the present embodiment, it is not essential that the dummy layer portions 91 are made from a conductive material, though in a situation in which the dummy layer portions 91 are made from a metal material, preferably Cu, Al, Ti, Ta or the like should be used.

Although the solid-state imaging apparatus relating to the present embodiment has a CCD type configuration, the solid-state imaging apparatus relating to the present embodiment includes the dummy layer portions 91 at the same layer level as the pixel electrodes 904, and consequently is able to achieve the same advantageous effects as described above.

Furthermore, the solid-state imaging apparatus relating to the present embodiment may be modified in the same way as described above in any of the first to thirteenth modified examples. When the solid-state imaging apparatus is modified as described in any of the above modified examples, the same advantageous effects as described therein can be achieved.

[Supplementary Explanation]

FIG. 1 is a block diagram which is merely used to schematically illustrate configuration and does not in any way limit the present disclosure. For example, it is not essential that the dummy layer portions 11 surround the periphery of the pixel region 10, and alternatively the dummy layer portions 11 may be arranged in a region which is appropriate based on consideration of layout. Even in the above situation, clearly the above described effects can still be achieved to a greater extent than in the conventional solid-state imaging apparatus.

In a configuration in which dummy layer portions made from a light-blocking material are located above peripheral circuits, from a point of view of light-blocking properties, preferably each of the dummy layer portions should for example have an oblong shape with one side of length in a range from 50 μm to 150 μm (for example, 100 μm).

INDUSTRIAL APPLICABILITY

The present disclosure can be used to implement a solid-state imaging apparatus which is included in a digital camera or other imaging equipment.

LIST OF REFERENCE SIGNS 1 solid-state imaging apparatus
10, 90 pixel region
11, 21, 31, 41, 51, 71, 72, 73, 74, 75, 76, 81, 91 dummy layer portion
61 dummy layer
12 vertical driver
13 timing generator
14 signal processing circuit
15 horizontal driver
16 LVDS unit
17 serial converter
18 opposing electrode voltage supplier
19 pad
42, 52 lower dummy layer
53 dummy plug
100 pixel
101, 901 substrate
102, 902 insulating layer
103 connecting electrode
104, 804, 904 pixel electrode
105, 106, 905 connector
105a first barrier metal film
105b first metal film
107, 907 photoelectric conversion layer
108, 908 opposing electrode
109, 909 buffering layer
110, 910 sealing layer
111 color filter
112 planarizing layer
113 micro-lens
115 readout circuit
501, 502 resist mask
810a second metal film
810b second barrier metal film
903 gate insulating film
911, 1151 accumulation diode
912 vertical transfer channel
913 vertical transfer electrode
914 light-blocking film
1041, 1101 metal film

The invention claimed is:
1. A solid-state imaging apparatus comprising:
a substrate;
an insulating layer above the substrate;
a plurality of first electrodes in a pixel region above the insulating layer, the plurality of first electrode being arranged in a two dimensional array with intervals therebetween;
a second electrode covering the first electrodes in plan-view;
a photoelectric conversion layer between the second electrode and the first electrodes;
a planarization support layer above the insulating layer, the planarization support layer being in a peripheral region of the pixel region; and
a connecting electrode in a peripheral region of the planarization support layer in plan-view, the connecting electrode being configured to apply an electrical voltage to the second electrode, wherein
the planarization support layer and the first electrodes are at a same layer level above the insulating layer,
the planarization support layer is composed of a plurality of planarization support layer portions that are arranged above the insulating layer with intervals therebetween,
each of the planarization support layer portions is equal to each of the first electrodes in terms of shape and size, and
the intervals between the planarization support layer portions are equal to the intervals between the first electrodes.

2. The solid-state imaging apparatus of claim 1, wherein the planarization support layer portions are arranged to surround an entire periphery of the pixel region.

3. The solid-state imaging apparatus of claim 1, wherein the planarization support layer portions are arranged to at least triply surround an entire periphery of the pixel region.

4. The solid-state imaging apparatus of claim 1, wherein the insulating layer extends into an interval between each two of the first electrodes which are adjacent to one another, the insulating layer extending to a position that is higher than lower surfaces of the two first electrodes and lower than upper surfaces of the two first electrodes.

5. The solid-state imaging apparatus of claim 1, further comprising a peripheral circuit in a peripheral region of the pixel region, wherein
the planarization support layer is a light-blocking layer and covers the peripheral circuit in plan-view.

6. The solid-state imaging apparatus of claim 5, wherein the peripheral circuit is a vertical driver.

7. The solid-state imaging apparatus of claim 5, wherein the peripheral circuit is a horizontal driver.

8. The solid-state imaging apparatus of claim 1, wherein the planarization support layer is not electrically connected to the first electrodes, the second electrode, or the photoelectric conversion layer.

9. The solid-state imaging apparatus of claim 1, wherein each of the first electrodes includes at least one selected from the group consisting of TiN, Ti, Al, Ta, TaN, Cu and W.

10. The solid-state imaging apparatus of claim 1, further comprising a plurality of readout circuits configured to read-out an electrical charge signal generated in the photoelectric conversion layer, the readout circuits being in at least one of the substrate and the insulating layer in one-to-one correspondence with the first electrodes, wherein
each of the first electrodes is electrically connected to a corresponding one of the readout circuits.

11. A solid-state imaging apparatus comprising:
a substrate;
an insulating layer above the substrate;
a plurality of first electrodes in a pixel region above the insulating layer, the plurality of first electrode being arranged in a two dimensional array with intervals therebetween;
a second electrode covering the first electrodes in plan-view;
a photoelectric conversion layer between the second electrode and the first electrodes;

a planarization support layer above the insulating layer, the planarization support layer being in a peripheral region of the pixel region; and a connecting electrode in a peripheral region of the planarization support layer in plan-view, the connecting electrode being configured to apply an electrical voltage to the second electrode, wherein the planarization support layer and the first electrodes are at a same layer level above the insulating layer, and the planarization support layer and the first electrodes are made from similar metal materials.

12. A solid-state imaging apparatus comprising:

a substrate;

an insulating layer above the substrate;

a plurality of first electrodes in a pixel region above the insulating layer, the plurality of first electrode being arranged in a two dimensional array with intervals therebetween;

a second electrode covering the first electrodes in plan-view;

a photoelectric conversion layer between the second electrode and the first electrodes;

a planarization support layer above the insulating layer, the planarization support layer being in a peripheral region of the pixel region; and a connecting electrode in a peripheral region of the planarization support layer in plan-view, the connecting electrode being configured to apply an electrical voltage to the second electrode, wherein the planarization support layer and the first electrodes are at a same layer level above the insulating layer, and the planarization support layer is made from a metal material including at least one selected from the group consisting of Cu, Al, Ti, Ta and W.

* * * * *